(12) United States Patent
Eida

(10) Patent No.: US 7,227,518 B2
(45) Date of Patent: *Jun. 5, 2007

(54) ACTIVE-DRIVING TYPE ORGANIC EL DISPLAY DEVICE, AND A METHOD OF PRODUCING THE SAME

(75) Inventor: Mitsuru Eida, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/135,341

(22) Filed: May 24, 2005

(65) Prior Publication Data

US 2005/0218819 A1    Oct. 6, 2005

Related U.S. Application Data

(63) Continuation of application No. 09/959,601, filed on Oct. 31, 2001, now Pat. No. 6,995,736.

(30) Foreign Application Priority Data

Mar. 7, 2000    (JP)    .............................. 2000-061506

(51) Int. Cl.
G09G 3/30 (2006.01)

(52) U.S. Cl. ...................... 345/76; 345/45; 315/169.1; 315/169.3; 315/169.4

(58) Field of Classification Search ............ 345/76–82, 345/169.1, 169.3, 169.4, 45–47; 315/169.1, 315/169.3, 169.4

See application file for complete search history.

(56) References Cited

U.S. PATENT DOCUMENTS 5,483,120 A    1/1996    Murakami ................. 313/506
5,640,067 A    6/1997    Yamauchi et al.
5,834,893 A    11/1998    Bulovic et al. ............ 313/506
6,072,450 A    6/2000    Yamada et al. .............. 345/76

(Continued)

FOREIGN PATENT DOCUMENTS

| JP | 2-37385 | 2/1990 |
| JP | 3-233891 | 10/1991 |
| JP | 8-125297 | 5/1996 |
| JP | 8-330600 | 12/1996 |

(Continued)

OTHER PUBLICATIONS

Taiwanese Office Action mailed Apr. 24, 2002, with its translation.

*Primary Examiner*—Richard Hjerpe
*Assistant Examiner*—Kimnhung Nguyen
(74) *Attorney, Agent, or Firm*—Steptoe & Johnson LLP

(57) ABSTRACT

An organic EL display device and a method of producing the same wherein superior connection reliability can be obtained between a thin film transistor and a lower electrode of an organic EL element even if a color-converting medium is provided adjacent light-emitting face of the organic EL element. For this purpose, in an active-driving type organic EL display device comprising an organic EL element made so as to have an organic luminous medium sandwiched between an upper electrode and a lower electrode, and a thin film transistor for controlling luminescence of the organic EL element, the luminescence of the organic EL element is taken out from the lower electrode, a color-converting medium is provided adjacent the lower electrode, and an inclined electrically connecting member is set between the lower electrode and the thin film transistor.

4 Claims, 16 Drawing Sheets

U.S. PATENT DOCUMENTS

| | | | |
|---|---|---|---|
| 6,091,194 A | 7/2000 | Swirbel et al. | 313/498 |
| 6,118,505 A | 9/2000 | Hisashi et al. | |
| 6,147,667 A | 11/2000 | Yamazaki et al. | 345/92 |
| 6,280,559 B1 | 8/2001 | Terada et al. | 156/295 |
| 6,307,322 B1 | 10/2001 | Dawson et al. | 315/169.1 |
| 6,995,736 B2 * | 2/2006 | Eida | 345/76 |

FOREIGN PATENT DOCUMENTS

| | | |
|---|---|---|
| JP | 09330793 A | 12/1997 |
| JP | 11-8473 | 1/1998 |
| JP | 10-55155 | 2/1998 |
| JP | 10-161563 | 6/1998 |
| JP | 10-189252 | 7/1998 |
| JP | 10 206888 A | 8/1998 |
| JP | 10-208879 | 8/1998 |
| JP | 10-232628 | 9/1998 |
| JP | 10-254383 | 9/1998 |
| JP | 10-289784 | 10/1998 |
| JP | 10-303525 | 11/1998 |
| JP | 10-324820 | 12/1998 |
| JP | 11-212493 | 8/1999 |
| JP | 2000-3785 | 1/2000 |
| WO | WO 97/20355 A | 6/1997 |
| WO | WO97/34447 | 9/1997 |

\* cited by examiner

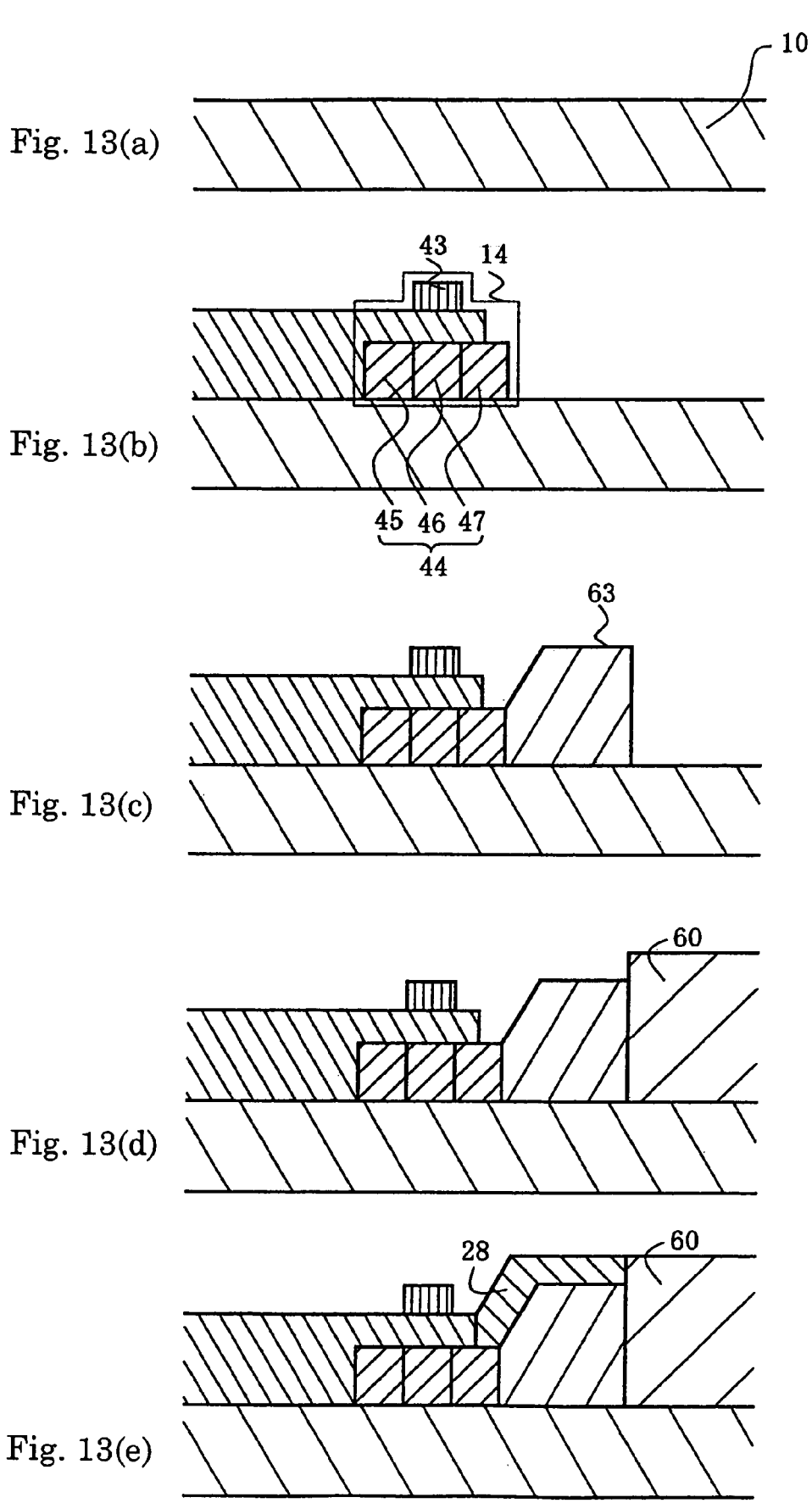

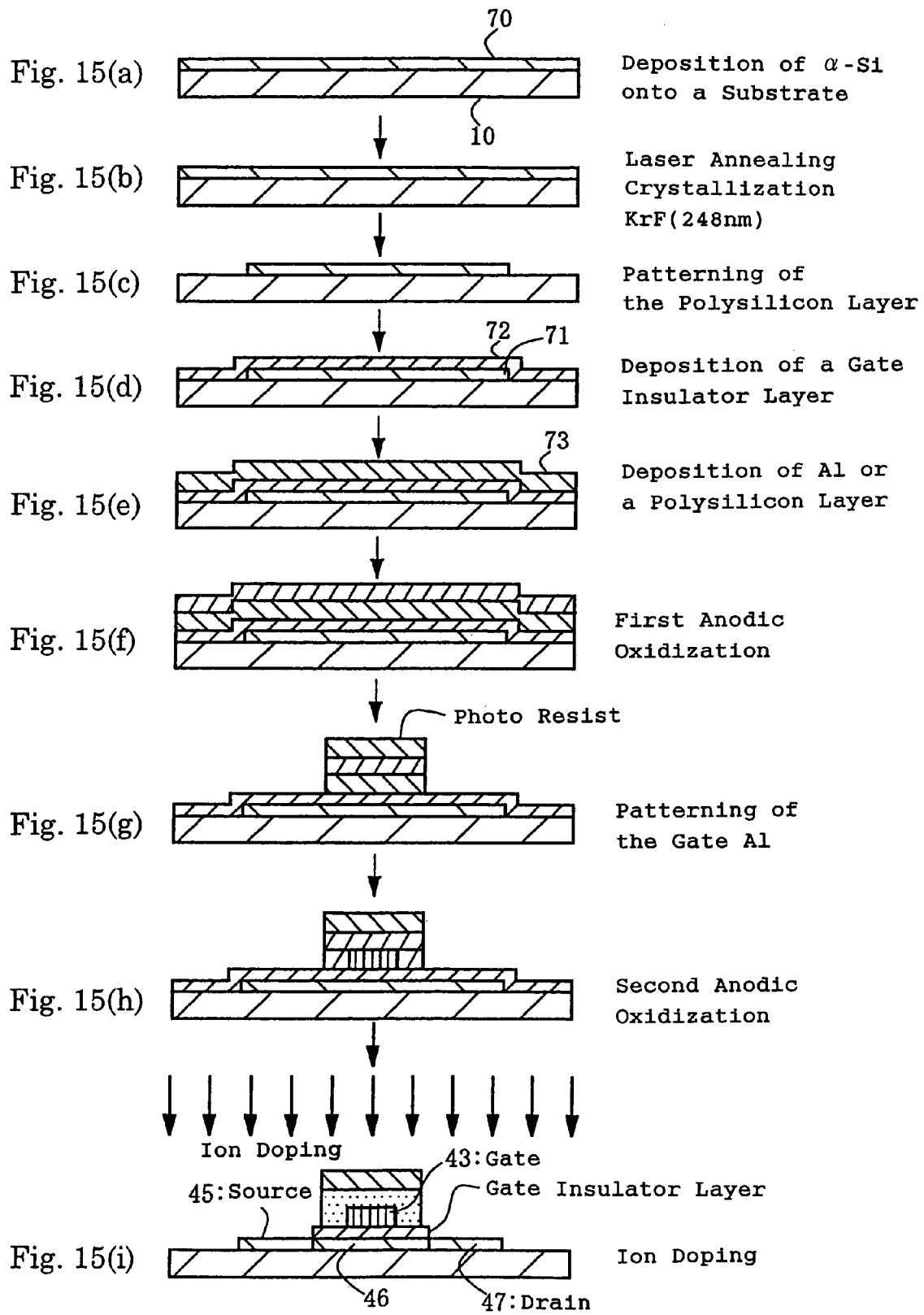

ACTIVE-DRIVING TYPE ORGANIC EL DISPLAY DEVICE, AND A METHOD OF PRODUCING THE SAME

This is a Continuation of application Ser. No. 09/959,601 filed Oct. 31, 2001 now U.S. Pat. No. 6,995,736.

TECHNICAL FIELD

This invention relates to an active-driving type organic EL display device (which may be referred to as an organic EL display device, hereinafter) having thin film transistors, and a method of producing the same. More specifically, this invention relates to an organic EL display device in which even if a color-converting medium is arranged on the side of a luminous face of an organic EL element, superior reliability of connection between thin film transistors and lower electrodes of the organic element can be obtained, and a method of producing the same.

In claims and detailed description of the present specification, "EL" means "electroluminescence".

BACKGROUND ART

Conventionally, there has been known a passive-driving type organic EL display device wherein an organic EL element having an organic luminous layer sandwiched between electrodes is driven by means of an XY matrix electrode structure. This type of organic EL display device is disclosed in, for example, Japanese Patent Application Laid-Open (JP-A) Nos. 2-37385 and 3-233891.

In such a passive-driving type organic EL display device, the so-called line-sequence driving is performed. Thus, in case that the device has several hundreds of scanning lines, required instantaneous brightness is several hundreds times larger than observed brightness. As a result, the following problems have been caused:

(1) Since the driving voltage becomes 2 to 3 times higher than a regular DC voltage, the luminous efficiency is lowered or the power consumption becomes large.

(2) Since the electric current instantaneously becomes several hundreds times larger, the organic luminous layer tends to deteriorate.

(3) Since the amount of electric current is very large in the same way as in the item (2), a voltage drop in the wiring of electrodes becomes large.

Therefore, in order to solve the problems that the passive-driving type organic EL display device has, there have been suggested an active-driving type organic EL display device having thin film transistors (which may be referred to as TFTs, hereinafter) to drive organic EL elements.

Such an active-driving type organic EL display device has features of its driving voltage being drastically lowered, the luminous efficiency thereof is improved, and of its power consumption being reduced, or the like, as compared with the passive-driving type organic EL display device.

However, even the active-driving type organic EL display device having such effects as above has a problem that the reliability of connection between its organic EL elements and TFTs is poor. For example, it is suggested that the organic EL elements and TFTs be electrically connected by using a metal material such as aluminum or chromium. However, a transparent electrode, for example ITO (indium tin oxide), of the organic EL elements, thereof has easily stripped from those metal materials. The metal material has corroded because of water content present in the surroundings. What is worse, the migration has occurred, causing a leakage current.

As shown in FIG. 19, JP-A Nos. 8-330600 and 10-254383 disclose an organic EL display device 200 having an organic EL element 226 and a TFT 237, as well as having an electrically connecting member 228 made of a composite material for electrically connecting the EL element 226 to the TFT 237.

In this organic EL display device 200, a composite thin film composed of a metal thin film made of a low-resistance material for a lower layer 250, and a titanium nitride thin film having superior corrosion-resistance for an upper layer 251, is disclosed for the electrically connecting member. For example, a barrier metal made of aluminum/titanium nitride, tungsten/titanium nitride, molybdenum/titanium nitride, or the like is used for the composite thin film.

As shown in FIG. 20, JP-A No. 10-189252 discloses an active-driving type organic EL display device 300 wherein a drain region 347 of a TFT 344 is electrically connected to a lower electrode 302 of an organic EL element 326 are through a contact hole (via hole) 354 which is vertically formed in an inter-insulator 313.

However, in the active-driving type organic EL display device 200 disclosed in the aforementioned JP-A No. 8-330600 and 10-254383, the barrier metal composed of the metal thin film of the lower layer 250 and the titanium nitride thin film of the upper layer 251 is horizontally formed to connect a drain region 236 of the TFT 237 to a lower electrode 222 of the organic EL element electrically. Therefore, if a color-converting medium (not shown) such as a thick color filter or color-converting film is provided adjacent the lower electrode of the organic EL element 226 for example, the following problems arise: (i) A level-difference between the drain region of the TFT and the lower electrode is generated to make it difficult to connect them electrically to each other; (ii) The barrier metal is easily damaged so that the reliability of the connection becomes poor or the like. Although the color-converting medium was made thin, a new problem that the color-converting efficiency is lower has been encountered.

If the color-converting medium (not shown) provided adjacent the lower electrode of the active-driving type organic EL display device 300 disclosed in the aforementioned JP-A No. 10-189252 is made thick, the reliability may be lowered for the electric connection through the vertically-formed contact hole 354.

That is to say, if the thickness of the color-converting medium is made, for example, 5 μm or more thick, the thermal expansion of the color-converting medium becomes large when the medium is heated, thereby the wires snapping in the contact hole having a thermal expansion smaller than that of the color-converting medium.

According to the electric connection using the vertically-formed contact hole 354, it is difficult that an electro-conductive material is uniformly filled into the contact hole since this hole is long. It has been substantially impossible to use a vapor-deposition method or a sputtering method, which is an ordinary method for forming an electrically connecting member.

Thus, the present inventors have made eager investigations on the above-described problems, thereby finding out that by disposing an electrically connecting member obliquely between an organic EL element and a TFT, superior connection reliability can be obtained with the above-described problems being solved.

That is, an object of the present invention is to provide an active-driving type organic EL display device wherein a lower electrode of an organic EL element can easily be connected electrically to a drain region of a TFT even if a color-converting medium having a thickness of, for example, 5 µm or more is provided adjacent the lower electrode, so that superior connection reliability can be obtained.

Another object of the present invention is to provide a producing method making it possible to supply such an active-driving type organic EL display device efficiently.

DISCLOSURE OF THE INVENTION

[1] According to one aspect of the present invention, there is provided an active-driving type organic EL display device comprising an organic EL element made so as to have an organic luminous medium sandwiched between an upper electrode and a lower electrode, and a TFT for controlling luminescence of the organic EL element, wherein the luminescence of the organic EL element is taken out from the lower electrode, a color-converting medium provided adjacent the lower electrode, and an inclined electrically connecting member is provided between the lower electrode and the TFT.

Namely, the organic EL display device having such a structure makes it possible to form the electrically connecting member easily between the organic EL element and the TFT and to obtain superior connection reliability.

[2] When producing the active-driving type organic EL display device of the present invention, it is preferred that the inclination angle of the electrically connecting member to a horizontal plane is set to a value within the range of 10° to 80°.

The setting of the electrically connecting member to have such an inclination angle makes it possible to obtain better electric connection between the organic EL element and the TFT and makes the formation of the electrically connecting member to be formed easier.

[3] When producing the active-driving type organic EL display device of the present invention, it is preferred that an inclined plane be made in part of the color-converting medium, and that the electrically connecting member be disposed along the inclined plane.

Such a structure makes it possible to use a side of the color-converting medium as a supporting portion for the electrically connecting member and to set the inclined electrically connecting member easily, and further to improve the durability of the electrically connecting member.

[4] When producing the active-driving type organic EL display device of the present invention, it is preferred that the electrically connecting member be a via hole formed in an inter-insulator provided between the organic EL element and the TFT.

If the electrically connecting member is the via hole described above, it is easy to set the electrically connecting member so as to be inclined. Moreover, the electrically connecting member can contact to the organic EL element and TFT with the wide area.

[5] When producing the active-driving type organic EL display device of the present invention, it is preferred that an oblique member for inclining the electrically connecting member be disposed at a side end of the color-converting medium.

By making the oblique member an exclusive supporting holder for the electrically connecting member, the electrically connecting member can be formed precisely and further the durability and the like of the electrically connecting member can be improved.

[6] When producing the active-driving type organic EL display device of the present invention, it is preferred that the electrically connecting member be an electric wire made of a sintered electro-conductive paste.

If the electrically connecting member is the electric wire made of the sintered electro-conductive paste as described above, it is easy to set the electrically connecting member inclined. By using the electro-conductive paste for the electric wire, superior adhesion can be obtained for the lower electrode and the TFT. Furthermore, using the electro-conductive paste makes it possible to utilize the side of the color-converting medium conveniently as the supporting portion for the electrically connecting member. Therefore, the durability of the resultant electrically connecting member can also be improved.

[7] When producing the active-driving type organic EL display device of the present invention, it is preferred that the electrically connecting member be a bonding wire.

The electrically connecting member having such a structure makes it possible to attain electric connection between the lower electrode and the TFT easily and promptly even if a level-difference due to providing the color-converting medium and the like is generated.

[8] When producing the active-driving type organic EL display device of the present invention, it is preferred the electrically connecting member be made of indium zinc oxide (IZO).

Since indium zinc oxide (IZO) is an amorphous compound (non-crystal structure) and is superior in etching properties, the electrically connecting member can be disposed precisely.

Indium zinc oxide (IZO) has good affinity with a metal thin film made of aluminum, gold or the like. Thus, superior electric connection properties can be obtained.

Furthermore, indium zinc oxide (IZO) makes it possible to form a denser film and is resistant to stress destruction, as compared with ITO and the like, which are crystalline compounds. Therefore, IZO is superior in moisture resistance and durability. Accordingly, superior electric connection properties can be obtained greater than a long period even if the electrically connecting member is formed to have an inclined plane.

[9] When producing the active-driving type organic EL display device of the present invention, it is preferred that the lower electrode be made of indium zinc oxide (IZO) or indium tin oxide (ITO).

Such a structure makes light-transmissivity of the lower electrode superior, and makes it possible to perform charge injection into the EL element at a low resistance. Furthermore, in case that indium zinc oxide (IZO) is used as the electrically connecting member, better electric connection properties can be obtained.

[10] When producing the active-driving type organic EL display device of the present invention, it is preferred that the lower electrode and the electrically connecting member be integrally made of a non-crystalline electro-conductive oxide, for example, indium zinc oxide.

Such a structure makes it easy to form the display device and makes it possible to reduce the number of electrically connecting spots.

[11] When producing the active-driving type organic EL display device of the present invention, it is preferred that a part of the electrically connecting member be provided with a metallized portion.

Such a structure makes it possible to make connection resistance lower at electrically connecting spots between the electrically connecting member and the organic EL element or the TFT.

[12] When producing the active-driving type organic EL display device of the present invention, it is preferred that the electrically connecting member be set to a value within the range of 0.01 to 100 μm.

Such a structure makes it possible to make resistance loss small in the electrically connecting member, and to obtain a desirable durability or film-forming properties.

[13] According to another aspect of the present invention, there is provided an active-driving type organic EL display device comprising an organic EL element made so as to have an organic luminous medium sandwiched between an upper electrode and a lower electrode, and a TFT for controlling luminescence of the organic EL element, wherein the luminescence of the organic EL element is taken out from the lower electrode, a color-converting medium is provided adjacent the lower electrode, and the color-converting medium is embedded in both or either of an inter-insulator and a supporting substrate.

Such a structure makes it possible to decrease a level-difference between the TFT and the lower electrode set on the color-converting medium, thereby easily connecting the TFT to the lower electrode and further obtaining superior connection reliability.

[14] According to still another aspect of the present invention, there is provided an active-driving type organic EL display device comprising an organic EL element made so as to have an organic luminous medium sandwiched between an upper electrode and a lower electrode, and a TFT for controlling luminescence of the organic EL element, wherein the luminescence of the organic EL element is taken out from the lower electrode, a color-converting medium is provided adjacent the lower electrode, and a level adjusting layer for adjusting the level of the TFT is disposed between the TFT and the supporting substrate.

Such a structure makes it possible to make the level of the TFT substantially equal to that of the lower electrode of the organic EL element. Therefore, the electric connection can be more easily attained and further superior connection reliability can be gained.

[15] According to still another aspect of the present invention, there is provided a method of producing an active-driving type organic EL display device comprising an organic EL element made so as to have an organic luminous medium sandwiched between an upper electrode and a lower electrode, a color-converting medium for converting the color of EL luminescence taken out from the lower electrode, and a TFT for controlling luminescence of the organic EL element, wherein the producing method comprises the steps of:

forming the TFT, forming the color-converting medium, forming the electrically connecting member so as to be inclined, and forming the organic EL element.

Such producing method makes it possible to obtain an organic EL display device capable of performing full color display and having superior connection reliability.

[16] When carrying out the method of producing the active-driving type organic EL display device of the present invention, it is preferred that the method further comprise the step of making an inclined plane in a side end of the color-converting medium, and provide the electrically connecting member along the inclined plane in the step of forming the inclined electrically connecting member.

Such a producing method enables the electrically connecting member to be formed more easily. The resultant electrically connecting member is formed along the inclined plane of the color-converting medium. Therefore, even if the color-converting medium expands by heat, the electrically connecting member can follow the expanding color-converting medium easily.

[17] When carrying out the method of producing the active-driving type organic EL display device of the present invention, it is preferred that the lower electrode and the electrically connecting member are integrally made of indium zinc oxide.

By carrying out the method in this way, the electrically connecting member and the lower electrode can easily be formed in a short time. Resistance loss can also be lowered by reducing the number of the electrically connecting spots.

[18] When carrying out the method of producing the active-driving type organic EL display device of the present invention, it is preferred that the electrically connecting member be formed by a vacuum vapor deposition method or a sputtering method.

Consequently, the electrically connecting member can be formed easily, using the inclined plane of the color-converting medium and the like. Furthermore, superior heat resistance and vibration resistance can be obtained because the resultant electrically connecting member is a uniform thin film.

[19] When carrying out the method of producing the active-driving type organic EL display device of the present invention, it is preferred that the electrically connecting member be formed by using a sol-gel method.

Consequently the electrically connecting member can easily be formed without using any special forming machine and only by applying a raw material solution (sol) and thereafter by heating and reducing the sol.

[20] When carrying out the method of producing the active-driving type organic EL display device of the present invention, it is preferred that the method further comprise the step of metallizing at least one part of the electrically connecting member.

Such producing method makes it possible to lower connection resistance at connection spots, and to obtain the superior electrically connecting member.

BRIEF DESCRIPTION OF THE DRAWINGS

FIGS. 13(a) to 13(e) are producing step views showing the steps in a third embodiment (a first example).

FIGS. 15(a) to 15(i) are views showing parts of the steps for forming a TFT.

BEST MODE FOR CARRYING OUT THE INVENTION

Figure 1:
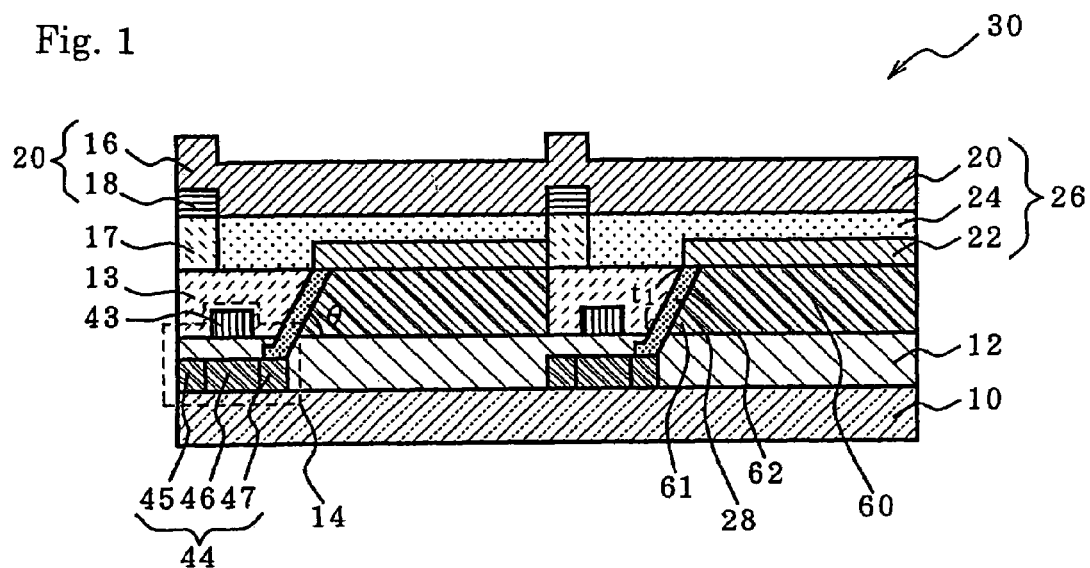
FIG. 1 is a sectional view of an active-driving type organic EL display device in a first embodiment.

Hereinafter, embodiments of the present invention will be specifically described referring to the drawings. The drawings which are referred to roughly show the size, the shape and the arrangement relationship of respective constituent members to such a degree that this invention can be understood. For example, electric connection between TFTs and signal electrodes or common electrodes may not be represented. Therefore, this invention is not limited to illustrated examples. In the drawings, hatching, which represents a cross section, may be omitted.

[First Embodiment]

As shown in FIG. 1, an organic EL display device of a first embodiment is an active-driving type organic EL display device 30 comprising a supporting substrate 10, a TFT 14 embedded in an inter-insulator (gate insulation film) 12 formed on the supporting substrate 10, an inter-insulator (flattening film) 13 and a color-converting medium 60, each of which is formed on the inter-insulator 12, an organic EL element 26 formed on these inter-insulator 13 and a color-converting medium 60, and an inclined electrically connecting member 28 for connecting the TFT 14 to the organic EL element 26 electrically.

Hereinafter, the constituent elements and the like in the first embodiment will be described referring to FIG. 1 and other figures.

1. Supporting Substrate

The supporting substrate (which may be referred to as the substrate, hereinafter) in the organic EL display device is a member for supporting the organic EL element, the TFT and the like, and it is preferred that the substrate be superior in mechanical strength and dimensional stability.

Specific examples of such a substrate include glass plates, metal plates, ceramic plates or plastic plates (made of polycarbonate resin, acrylic resin, vinyl chloride resin, polyethylene terephthalate resin, polyimide resin, polyester resin, epoxy resin, phenol resin, silicone resin, fluorine resin, and the like).

In order to avoid water invasion into the organic EL display device, it is preferred that the substrate made of such a material be subjected to moisture-proof treatment or hydrophobic treatment by forming an inorganic film or coating fluorine resin thereon.

Particularly to avoid water invasion into the organic luminous medium, it is preferred that the percentage of water content and the gas permeability of the substrate be restricted. Specifically, the percentage of water content and the gas permeability of the substrate are preferably restricted to 0.01% or less by weight and $1 \times 10^{-13}$ cc·cm/cm²·sec.cmHg or less, respectively.

2. Organic EL Element (1) Organic Luminous Medium

The organic luminous medium can be defined as a medium comprising an organic luminous layer capable of electroluminescence by means of recombination an electron with a hole. This organic luminous medium can be formed, for example, by depositing one of the following layers on the lower electrode:

i) organic luminous layer, ii) hole injection layer/organic luminous layer, iii) organic luminous layer/electron injection layer, iv) hole injection layer/organic luminous layer/electron injection layer, v) organic semiconductor layer/organic luminous layer, vi) organic semiconductor layer/electron barrier layer/organic luminous layer, and vii) hole injection layer/organic luminous layer/adhesion improving layer.

In general, the structure iv), among these structures, is favorably used since this structure can give a higher luminescence brightness and is superior in durability.

① Constituent Material

Examples of the luminous material of the organic luminous medium include p-quarterphenyl derivatives, p-quinquephenyl derivatives, benzothiazole compounds, benzoimidazole compounds, benzoxazole compounds, metal-chelated oxynoide compounds, oxadiazole compounds, styrylbenezene compounds, distyrylpyrazine compounds, butadiene compounds, naphthalimide compounds, perylene derivatives, aldazine derivatives, pyraziline derivatives, cyclopentadiene derivatives, pyrrolopyrrole derivatives, styrylamine derivatives, coumarin derivatives, aromatic dimethylidine compounds, metal complexes whose ligand is an 8-quinolinol derivative, and polyphenyl compounds or a combination selected therefrom.

Among these organic luminous materials, 4,4'-bis(2,2-di-t-butylphenylvinyl)biphenyl (abbreviated to DTBPBBi), 4,4'-bis(2,2-diphenylvinyl)biphenyl (abbreviated to DPVBi) and derivatives thereof as aromatic dimethylidine compounds are more preferred, for example, for blue luminous materials.

It is also suitable to prepare an organic luminous material having an distyryl arylene skeleton and the like such as an aromatic dimethylidine compound, as a host material, which is doped with a fluorescent dye emitting intense light in the range from blue to red, such as a coumarin material, or with a fluorescent dye emitting the same color as the host material. More specifically, the above-described DPVBi or the like are used as the host material, and 1,4-bis[4-(N,N-diphenylaminostyrylbenzene)] (abbreviated to DPAVB) or the like are used as the dopant, to make it possible to give blue luminescence.

② Thickness

Although the thickness of the organic luminous medium is not limited, it is preferably set to a value within the range of 5 nm to 5 μm, for example.

The reason is as follows. If the thickness of the organic luminous medium is smaller than 5 nm, luminescence brightness and durability may be lowered. On the other hand, if the thickness of the organic luminous medium is greater than 5 μm, the applied voltage may become high.

Accordingly, the thickness of the organic luminous medium is more preferably set to a value within the range of 10 nm to 3 μm, and still more preferably set to a value within the range of 20 nm to 1 μm.

(2) Electrodes

Hereinafter, the upper electrode and the lower electrode will be described. However, depending on the structure of the organic EL element, the upper electrode and the lower electrode may be equivalent to an anode layer and a cathode layer, respectively, or to a cathode layer and an anode layer, respectively.

① Lower Electrode

The lower electrode may be an anode layer or a cathode layer, depending on the structure of the organic EL display device. However, in case that the lower electrode corresponds to an anode layer, it is preferred to use a metal, an alloy, an electro-conductive compound, or a mixture thereof having a large work function (for example, of 4.0 eV or more). Specifically, it is preferred to use indium tin oxide (ITO), indium zinc oxide (IZO), copper iodide (CuI), tin oxide ($SnO_2$), zinc oxide (ZnO), gold, platinum, and palladium or a combination selected therefrom.

Using these electrode materials, the lower electrode having a uniform thickness can be formed by a method capable of depositing a film in a dry process, such as a vacuum vapor deposition method, a sputtering method, an ion-plating method, an electron beam vapor deposition method, a CVD (Chemical Vapor Deposition) method, an MOCVD (Metal Oxide Chemical Vapor Deposition) method, or a plasma enhanced CVD.

Since electroluminescence is required to be taken out from the lower electrode in the present invention, it is necessary that the lower electrode be made transparent. Therefore, it is preferred to use the above-described electrode material to make the transmission of the electroluminescence to a value of 70% or more.

The film thickness of the lower electrode is not limited, and is preferably set to a value within the range of, for example, 10 to 1000 nm, and more preferably set to a value within the range of 10 to 200 nm.

This is to make the lower electrode conductive and to obtain a transmission of electroluminescence of 70% or more.

Figure 2A:
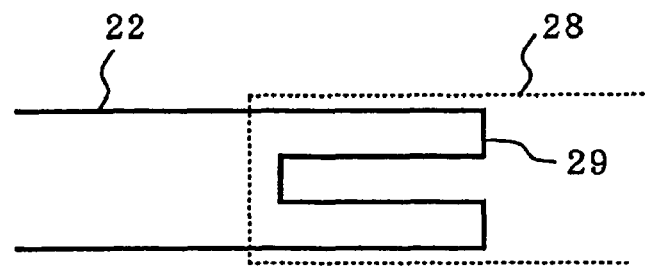
FIGS. 2(a) to 2(d) are views showing structure examples of a lower electrode.
Figure 2B:
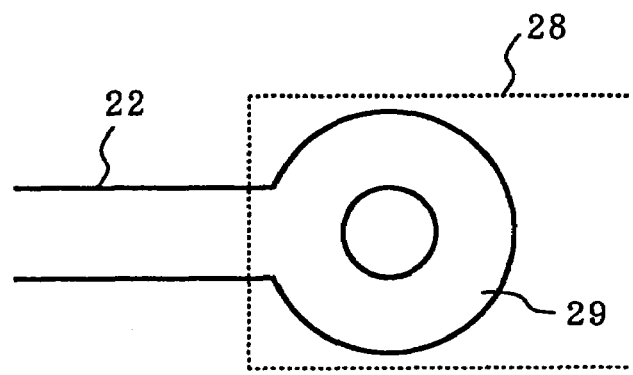
Figure 2C:
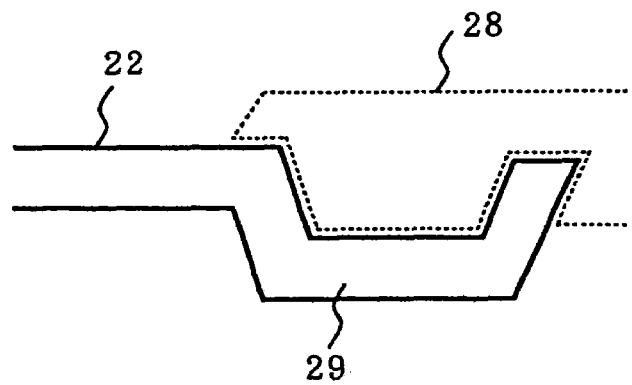
Figure 2D:
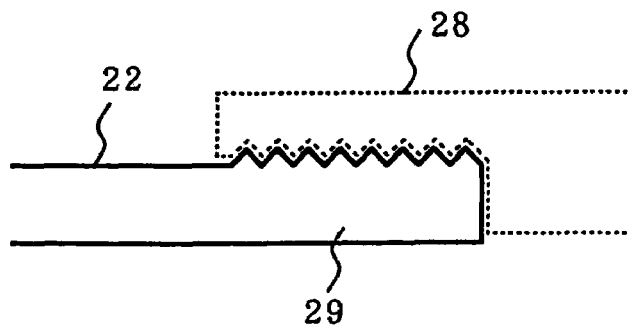

It is preferred that as shown in FIGS. 2(a) and 2(b), respectively, the lower electrode 22 have its tip portion 29 branched or circular with a hole. It is also preferred that as shown in FIGS. 2(c) and 2(d), respectively, the lower electrode 22 have the tip portion 29 with depression vertically or uneven structure.

Such a structure causes the contact area between the lower electrode and the electrically connecting member 28 to be large, and causes the adhesion therebetween to be improved, so that the connection resistance can be effectively lowered.

In FIGS. 2(a) to 2(d), the electrically connecting members 28 are represented by dotted lines to understand where the electrically connection members are connected. In these figures, the connecting members could be replaced with the electrode and vice versa. That is, in FIGS. 2(a) to 2(d), the tips of each electrically connection members may be represented by a solid line and the tips of each lower electrode may be may be represented by the dotted line.

In order to make the lower the connection resistance between electrode and the electrically connecting member lower, it is preferred to provide the lower electrode with a metallized portion or a bump, although not shown.

② Upper Electrode

On the other hand, the upper electrode may be an anode layer or a cathode layer, depending on the structure of the organic EL display device. However, in case that the lower electrode corresponds to, for example, a cathode layer, it is preferred to use a metal, an alloy, an electro-conductive compound, or a mixture or inclusion thereof having a work function smaller (for example, smaller than 4.0 eV) than that of the anode layer.

Specifically, it is preferred for the electrode to use sodium, sodium-potassium alloy, cesium, magnesium, lithium, magnesium-silver alloy, aluminum, aluminum oxide, aluminum-lithium alloy, indium, rare earth metals, mixtures of an organic luminous medium and these metals, and mixtures of an electron injection layer material and these metals solely or in combination selected therefrom.

The film thickness of the upper electrode is not limited, and is preferably set to a value within the range of, for example, 10 to 1000 nm, and more preferably set to a value within the range of 10 to 200 nm.

This is to obtain a given surface resistance and good electric connection reliability.

As shown in FIG. 1, the upper electrode 20 is preferably composed of a main electrode 16 and an auxiliary electrode 18 made of a material having a resistivity lower than that of the main electrode 16.

Such a structure makes it possible to reduce the surface resistance of the upper electrode 20 significantly. Thus, the density of current flowing through the organic luminous medium can be reduced, so that the life of the organic luminous medium can be significantly prolonged.

(3) Inter-Insulator

The inter-insulator of the organic EL display device of the present invention is disposed near or around the organic EL element and the TFT. The inter-insulator principally flattens the unevenness of a fluorescent medium or a color filter, so as to be used as a flattened undercoat when forming the lower electrode of the organic EL element. Furthermore, the inter-insulator is used for electric insulation for forming a high resolution wiring material, electric insulation (prevention of a short circuit) between the lower electrode and the upper electrode of the organic EL element, electric insulation and mechanical protection of the TFT, electric insulation between the TFT and the organic EL element, and the like.

Therefore, the inter-insulator may be referred to as a flattening film, an electric insulator film, a barrier, a spacer or the like, if necessary. The Term of "inter-insulator" in the present invention implies all of them.

① Constituent Material

Examples of the constituent material used in the inter-insulator generally include organic substances such as acrylic resin, polycarbonate resin, polyimide resin, fluorinated polyimide resin, benzoguanamine resin, melamine resin, cyclic polyolefin, Novolak resin, polyvinyl cinnamate, cyclic rubber, polyvinyl chloride, polystyrene, phenol resin, alkyd resin, epoxy resin, polyurethane resin, polyester resin, maleic acid resin, and polyamide resin.

In case that the inter-insulator is made of an inorganic substance, preferred examples of the inorganic substance include silicon oxide ($SiO_2$ or $SiO_x$), aluminum oxide ($Al_2O_3$ or $AlO_x$), titanium oxide ($TiO_2$), yttrium oxide ($Y_2O_3$ or $YO_x$), germanium oxide ($GeO_2$ or $GeO_x$), zinc oxide (ZnO), magnesium oxide (MgO or $MgO_x$), calcium oxide (CaO), boric acid ($B_2O_3$), strontium oxide (SrO), barium oxide (BaO), lead oxide (PbO), zirconia ($ZrO_2$), sodium oxide ($Na_2O$), lithium oxide ($Li_2O$), potassium oxide ($K_2O$), silicon nitride ($Si_3N_4$), silicon nitride oxide ($SiO_xN_Y$) and calcium fluoride ($CaF_2$). The values x and Y in the structural formulae representing the inorganic substances are within the range of 0.1 to 3.

Particularly in case that heat-resistance is required, it is preferred to use acrylic resin, polyimide resin, fluorinated polyimide, cyclic polyolefin, epoxy resin, or inorganic substances among these constituent materials.

These inter-insulators are preferably processed into a desire pattern by introducing light-sensitive groups into the constituent materials and thereafter by using photolithography, otherwise by printing.

② Thickness of the Inter-Insulator

The thickness of the inter-insulator depends on the resolution of display, as well as unevenness of a fluorescent medium or a color filter combined with the organic EL element. It is preferably within the range of 10 nm to 1 mm.

This is because such a structure makes it possible to flatten the unevenness of the fluorescent medium or the color filter sufficiently and to reduce the viewing angle dependency of high resolution display.

Accordingly, the thickness of the inter-insulator is more preferably 100 nm to 100 μm, and still more preferably 100 nm to 10 μm.

③ Forming Method

The method for forming the inter-insulator is not limited. The layer is preferably formed, for example, by a spin coating method, a casting method, a screen-printing method or the like. It is also preferable to form by a sputtering method, a vapor-deposition method, a chemical vapor deposition method (CVD method), ion plating method or the like.

3. Thin Film Transistor (TFT)

(1) Structure

Figure 3:
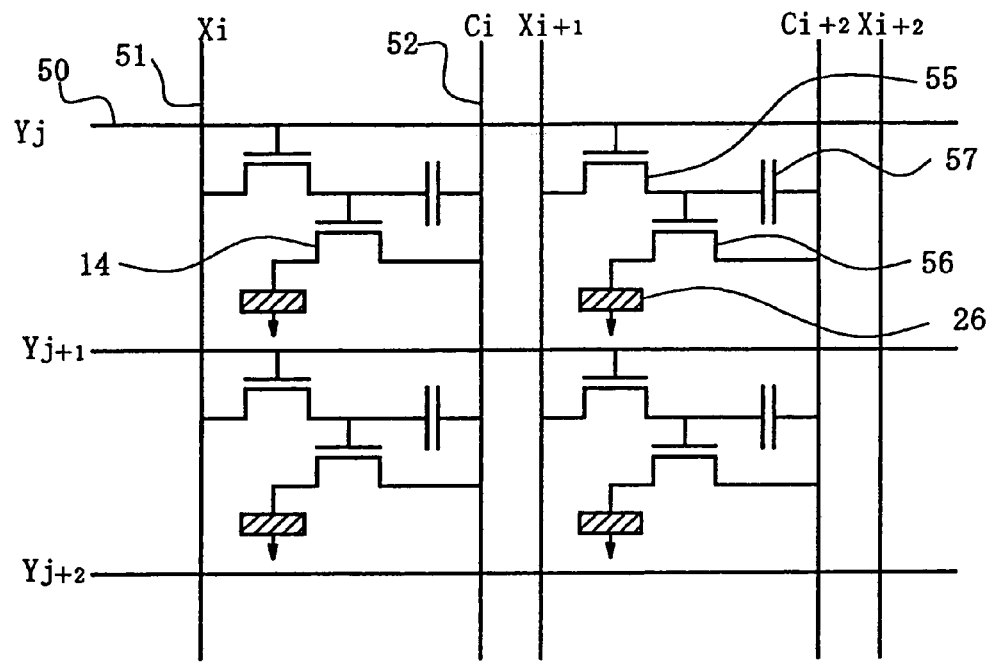
FIG. 3 is a circuit diagram showing an electric switch connection structure including TFTs.
Figure 4:
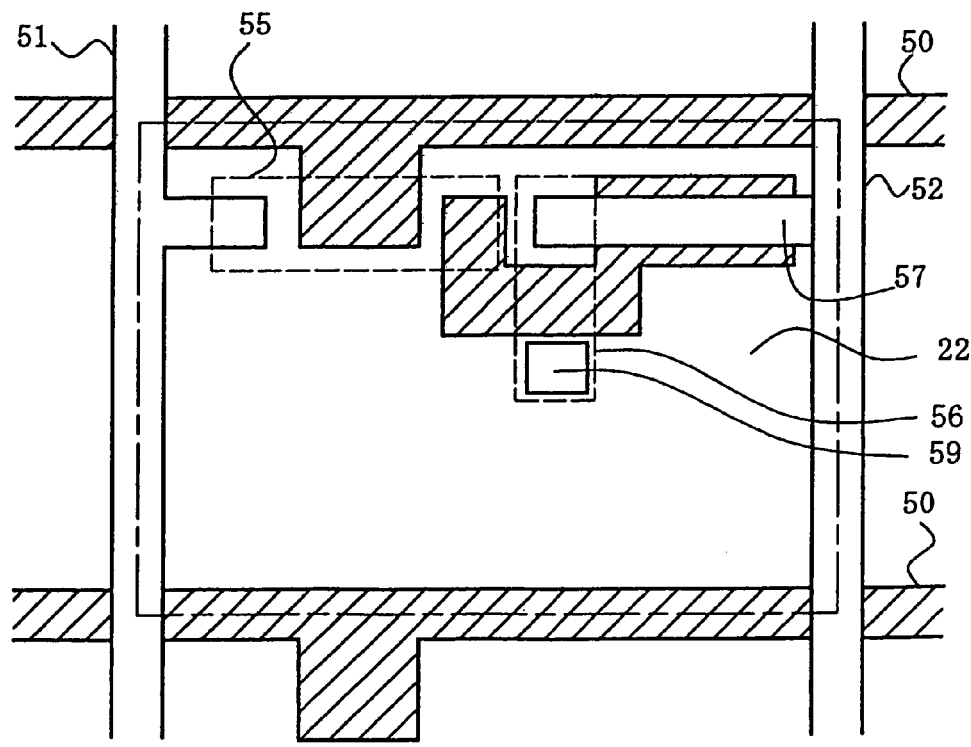
FIG. 4 is a transparent plan view showing the electric switch connection structure including the TFTs.

As shown in FIGS. 1 and 3 to 4, an embodiment of the active-driving type organic EL display device in the first embodiment has at least one TFT 14 and an organic EL element 26 driven by this TFT 14 on a substrate 10.

A color-converting medium 60 and an inter-insulator 13 whose surface is made flat are arranged between the TFT 14 and a lower electrode 22 of the organic EL element 26. A drain 47 of the TFT 14 is electrically connected to the lower electrode 22 of the organic EL element 26 through an electrically connecting member 28 arranged in the boundary between the inter-insulator 13 and the color-converting medium 60.

As shown in a circuit diagram of FIG. 3, a plurality of scanning electrode lines (Yj–Yj+n) 50, (the number of which is n is 1 to 1000, for example), and signal electrode lines (Xi–Xi+n) 51 arranged in an XY matrix are electrically connected to the TFT 14. Furthermore, common electrode lines (Ci–Ci+n) 52 arranged in parallel to the signal electrode lines 51 are electrically connected to the TFT 14.

It is preferred that these electrode lines 50, 51 and 52 be electrically connected to the TFT 14 and constitute an electric switch for driving the organic EL element 26 together with a condenser 57. In other words, it is preferred that this electric switch be electrically connected to the scanning electrode line 50 and the signal electrode line 51 and the like, and be composed of for example, at least one first transistor (which may be referred to as Tr1, hereinafter) 55, a second transistor (which may be referred to as Tr2, hereinafter) 14 (56), and a condenser 57.

It is preferred that the first transistor 55 have a function for selecting a luminous pixel and the second transistor 56 have a function for driving the organic EL element.

As shown in FIG. 1, an active layer 44 in the first transistor (Tr1) 55 and the second transistor (Tr2) 56 are composed of semiconductor regions 45 and 47 doped into an n type and of a non-doped semiconductor region 46 not doped, and can be represented as n+/i/n+.

The source 45 and the drain 47 is assigned to the respective semiconductor region doped into the n type. They constitute the transistors 55 and 56 as a whole together with a gate 43 deposited through a gate oxide film 12 on the non-doped semiconductor region.

In the active layer 44, the semiconductor regions 45 and 47 doped into the n type may be doped into the p type so as to make a structure of p+/i/p+. The active layer 44 in the first transistor (Tr1) 55 and the second transistor (Tr2) 56 is preferably made of an inorganic semiconductor such as polysilicon or of an organic semiconductor such as thiophene oligomer or poly(p-phenylenevinylene). Polysilicon is a particularly preferred material since it is far more stable against electricity than amorphous Si (α-Si) when the electric current is supplied.

(2) Driving Method

Next, the method for driving the organic EL element by the TFT will be described.

As shown in a circuit diagram of FIG. 33, it is preferred that the TFT comprise the first transistor (Tr1) 55 and the second transistor (Tr2) 56, and that further the TFT constitute the electric switch.

Consequently, switching is executed by inputting a scanning pulse and a signal pulse through the XY matrix, so that the organic EL element 26 can be driven.

More specifically, an image can be displayed by inducing or stopping light emission from the organic EL element 26 by means of the electric switch.

When the organic EL element 26 is driven in this way by means of the electric switch, a desired first transistor 55 is selected by a scanning pulse transmitted through the scanning electrode line (which may be referred to as a gate line) (Yj–Yj+n) 50 as well as a signal pulse transmitted through the signal electrode line (Xi–Xi+n) 51, so that a given electrical charge is supplied to the condenser 57 formed between the common electrode line (Ci–Ci+n) 52 and the source 45 of the first transistor (Tr1) 55.

In this way, the gate voltage of the second transistor (Tr2) 56 turns into a constant value and the second transistor (Tr2) 56 turns into an ON state. Since in this ON state the gate voltage is held until a next gate pulse is transmitted, electric current continues to be supplied to the lower electrode 22 connected to the drain 47 of the second transistor (Tr2) 56.

Accordingly, the organic EL element 26 can be driven by the supplied current. Thus, the driving voltage for the organic EL element 26 can be significantly reduced and the luminous efficiency thereof improves. Moreover, power consumption can be reduced.

4. Electrically Connecting Member (1) Structure 1

As shown in FIG. 1, in the first embodiment, it is necessary to make the electrically connecting member 28 oblique. Because it is easy to form the electrically connection element 28. Furthermore, good connection reliability can be obtained since the electrically connecting member 28 acts like a spring between the organic EL element 26 and the TFT 14.

In case that the electrically connecting member 28 is made oblique, as shown in FIG. 1, it is preferred that the inclination angle ($\theta$) (the angle how the electrically connecting member 28 is inclined to the horizontal plane 100) be set to a value within the range of 10° to 80°.

The reason for this is as follows. If this inclination angle is greater than 80°, it may be difficult to form the electrically connecting member. On the other hand, if the inclination angle is smaller than 10°, the aperture ratio may be significantly lowered.

Therefore, the inclination angle of the electrically connecting member is more preferably set to a value within the range of 20° to 70°, and is still more preferably set to a value within the range of 30° to 60°.

(2) Structure 2

As shown in FIG. 1, it is preferred that a side end 61 of the color-converting medium 60 constitute an inclined plane 62 and that the electrically connecting member 28 be disposed along this inclined plane 62.

Such a structure makes it possible to use the side end 61 of the color-converting medium 60 as a supporting section for the electrically connecting member 28 and to easily dispose the inclined electrically connecting member 28 on the color-converting medium 60.

Such a structure makes it possible that the electrically connecting member 28 follows the expanding color-converting medium 60 easily even if the color-converting medium 60 is heated and thermally expands. Thus, superior connection reliability can be obtained. The inclined electrically connecting member 28 can easily be made, for example, only by forming the side end 61 of the color-converting medium 60 in such a way to be the inclined plane 62 having an inclination angle of 10° to 80° and by depositing thereon a metal thin film with a sputtering method or the like.

(3) Structure 3

Figure 5:
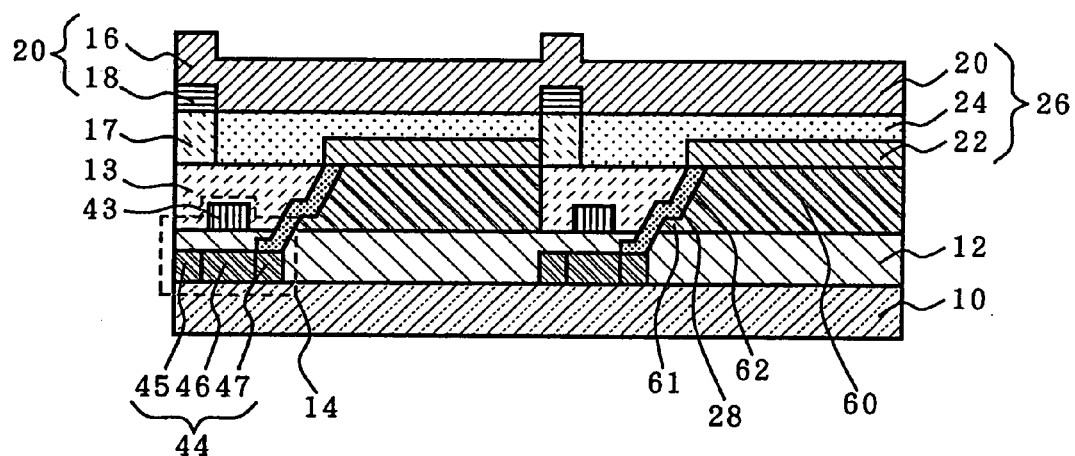
FIG. 5 is a view showing a modified example (a step form) of the electrically connecting member.

A part of the inclined electrically connecting member preferably contains a horizontal portion or a vertical portion. Therefore, for example, as shown in FIG. 5, the electrically connecting member 28 is preferably formed step-shaped.

Such a structure causes the electrically connecting member 28 to act like a spring between the organic EL element 26 and the TFT 14, and makes the electrically connecting member 28 adhere to the inclined plane well. Thus, better connection reliability can be obtained.

(4) Structure 4

Figure 6:
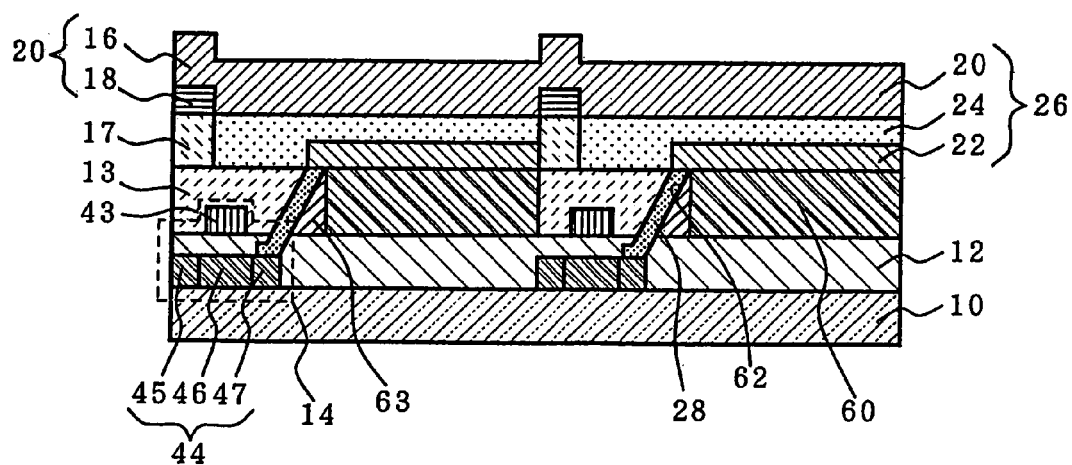
FIG. 6 is a view supplied to explain an oblique member.

As shown in FIG. 6, it is preferred that an electric insulator material be used to form an oblique member 63 attached to the side end 61 of the color-converting medium 60.

Providing the oblique member 63 makes it possible to give superior connection reliability via the electrically connecting member 28 even if the color-converting medium 60 is thermally expanded, since the oblique member 63 functions as a buffer member. Providing the oblique member 63 makes it possible to form the inclined electrically connecting member 28 easily without causing the color-converting medium 60 to have any inclined plane. This oblique member may be formed as a flattening film on the color-converting medium.

It is preferred that the oblique member 63 be made of the electric insulator material similar to that for the inter-insulator. Therefore, it is preferred to use, for example, acrylic resin, polyimide resin, fluorine resin, polyolefin resin, epoxy resin, silicon oxide ($SiO_2$), aluminum oxide ($Al_2O_3$), titanium oxide ($TiO_2$), silicon nitride ($Si_3N_4$), or the like.

The form of the oblique member 63 is not limited so long as it partially has an inclined plane. In general, the oblique member preferably has a triangular form.

(5) Structure 5

Figure 7:
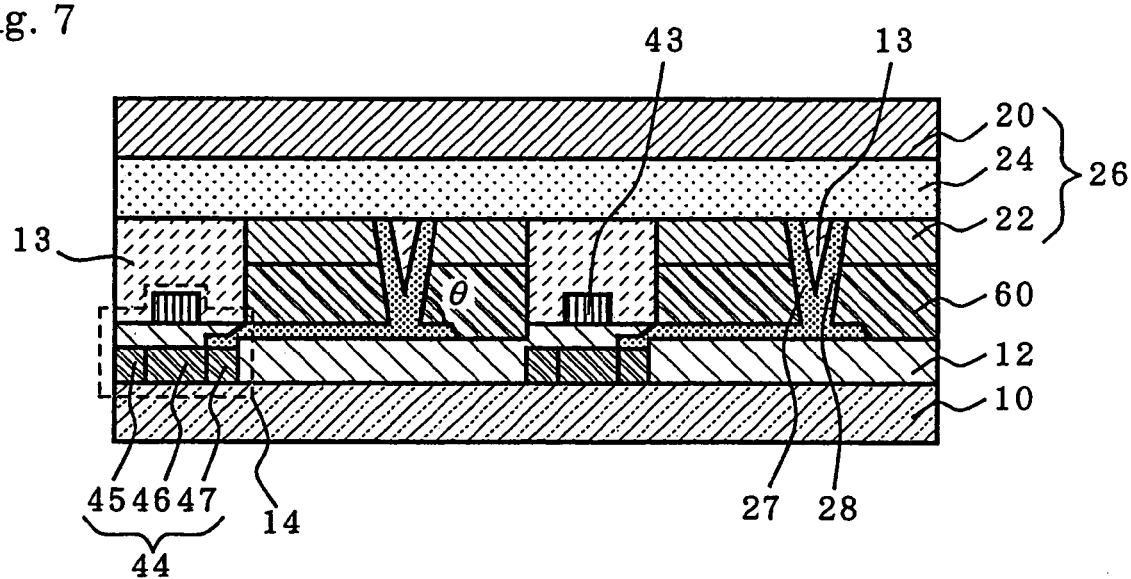
FIG. 7 is a view showing a modified example (a V-shaped form) of the electrically connecting member.

As shown in FIG. 7, it is also preferred that by making two inclined planes, which roughly take a V-shaped form, in a middle part of the color-converting medium 60, two electrically connecting members (a first electrically connecting member 27 and a second electrically connecting member 28) are provided adjacent the V-shaped inclined planes.

Such a structure makes it possible to make the connection resistance lower since the two electrically connecting members 27 and 28 are electrically connected to the lower electrode 22, and makes it possible to improve the connection reliability.

The respective inclination angle ($\theta$) of the two electrically connecting members 27 and 28 are preferably set to values within the range of 40° to 80°. Setting this inclination angle makes it possible to lower decreasing the aperture ratio of pixels even if the two electrically connecting members 27 and 28 are disposed.

It is not necessarily required to make the inclination angles ($\theta$) of the electrically connecting members 27 equal to that of the electrically connecting member 28. On one hand, the inclination angle of the first electrically connecting member 27 may be set to a value within the range of 10° to 40°. On the other hand, the inclination angle of the second electrically connecting member 28 may be set to a value within the range of 40° to 80°.

(6) Structure 6

Figure 8:
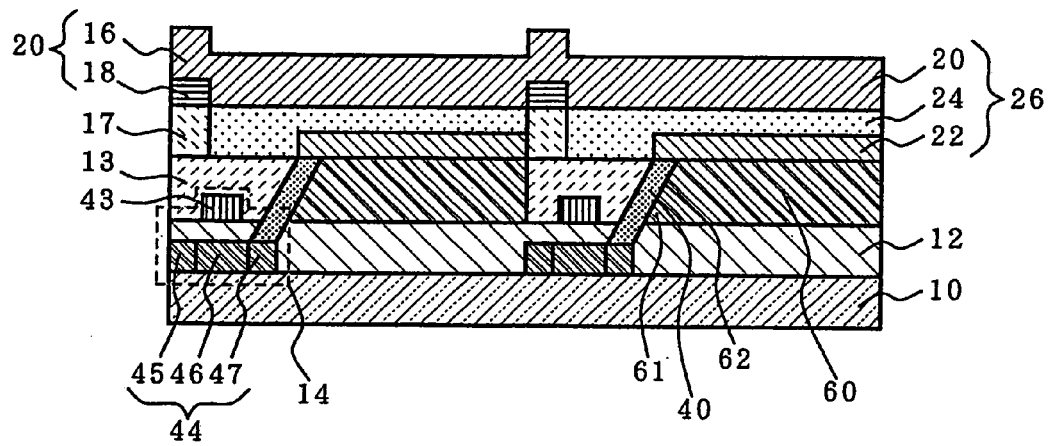
FIG. 8 is a view showing a modified example (a via hole) of the electrically connecting member.

As shown in FIG. 8, it is preferred that an electrically connecting member 40 be an inclined via hole formed through inside the inter-insulator 13 or in a boundary area between the inter-insulator 13 and the color-converting medium 60.

If the electrically connecting member 40 is the via hole as described above, it is easy to make the electrically connecting member 40 be inclined. Moreover, good electric connection properties can be obtained since the contact area with the lower electrode 22 and the contact area with the TFT 14 can be made large.

It is preferred to set the diameter of the via hole, which is actually the electrically connecting member 40, to a value within the range of 0.1 to 100 µm. The reason for this is as follows. If the diameter of the via hole is smaller than 0.1 µm, it may be difficult to form the via hole. The connection reliability may be lowered. On the other hand, if the diameter of the via hole is greater than 100 µm, it may be difficult to form the via hole. A short circuit may happen between the adjacent via holes.

It is preferred that the via hole, which is nothing but the inclined electrically connecting member 40 be formed by photo etching or mechanical cutting, for example.

(7) Structure 7

Figure 9:
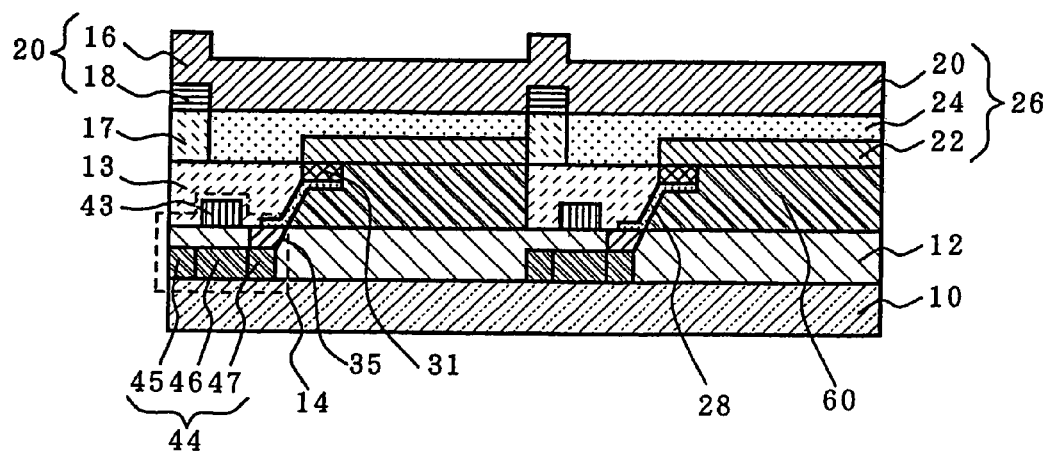
FIG. 9 is a view showing a modified example (having a metallized part) of the electrically connecting member.

As shown in FIG. 9, it is preferred that the electrically connecting member 28 be made of an electro-conductive inorganic material (including non-crystalline electro-conductive oxide) and that a part or the entire surface of the electrically connecting member be provided with the metallized portions 31 and 35.

Such a structure makes it possible to make lower the connection resistance at each of electrically connecting sites between the electrically connecting member 28 and the lower electrode of organic EL element 26, as well as the ones between the electrically connecting member 28 and the TFT 14.

Two of the metallized portions 31 and 35 may be made of the same forming material or made of different materials. Preferred examples of the material of the metallized portions include aluminum, platinum, gold, silver, copper, palladium, nickel, chromium, tantalum, tungsten, molybdenum, titanium, titanium nitride (TiN), tantalum nitride (TaN), silver-palladium-copper alloy (APC) and the like or a combination selected therefrom. By using these metals, the connection resistance of the connecting ends can surely be made low.

It is particularly preferred that titanium, molybdenum, chromium or APC is used in the metallized portion 31, and chromium or tungsten be used in the metallized portion 35. Such a structure makes it possible to lower the connection resistance of the connecting ends at the upper side (31) as well as the lower side (35) and to improve corrosion-resistance of the both sides.

Furthermore, the method for forming the metallized portions is not limited. It is preferred to adopt, for example, a plating method, a vapor deposition method, or a sputtering method.

When deciding the thickness of the metallized portions, it is preferred to take into consideration the connection resistance of the electrically connection spots. Specifically, it is preferred to set the thickness to a value within the range of 0.01 to 50 μm.

The reason for this is as follows. If the thickness of the metallized portions is smaller than 0.01 μm, the connection resistance of the electrically connection spots may not be lowered. On the other hand, if the thickness is greater than 50 μm, it may take much time to form the metallized portions.

Therefore, the thickness of the metallized portions is more preferably set to a value within the range of 0.01 to 30 μm, and is still more preferably set to a value within the range of 0.03 to 10 μm.

(8) Structure 8

The thickness of the electrically connecting member 28 is preferably set to a value within the range of 0.01 to 100 μm.

The reason for this is as follows. If the thickness of the electrically connecting member is smaller than 0.01 μm, the durability thereof may deteriorate. Further, Its resistance loss may become significantly large. On the other hand, if this thickness is greater than 100 μm, it may take very much time to form the electrically connecting member. Further, the electrically connecting member may become brittle.

Therefore, the thickness of the electrically connecting member is more preferably to a value within the range of 0.01 to 80 μm, and still more preferably set to a value within the range of 0.03 to 50 μm.

(9) Constituent Material

① Kind 1

The constituent material of the electrically connecting member 28 is not limited as long as it is conductive. Specific examples of such material include metal materials, alloy materials, electro-conductive inorganic materials, organic electric conductors, and carbon compounds.

Preferred examples of the metal materials include aluminum (Al), platinum (Pt), palladium (Pd), gold (Au), silver (Ag), copper (Cu), nickel (Ni), solder (Pd/Sn alloy), tin (Sn), lead (Pd), magnesium (Mg), molybdenum (Mo), indium (In), chromium (Cr), tantalum (Ta), titanium (Ti), tungsten (W), and silver-palladium-copper (APC), and the like or a combination selected therefrom.

In case that nickel (Ni) is used, electrolytic nickel obtained by electrolysis polymerization is preferred. This is because this electrolytic nickel is superior in etching properties and toughness.

② Kind 2

Preferred examples of the electro-conductive inorganic material which constitutes the electrically connecting member 28 include indium tin oxide (ITO), indium zinc oxide (IZO), tin oxide ($SnO_2$), zinc oxide (ZnO), antimony oxide ($SbO_2$), ZnS, ZnSe, ZnSSe, MgS, MgSSe, CdS, CdSe, CdTe, CdSSe and the like or a combination selected therefrom.

Among these electro-conductive inorganic materials, indium zinc oxide (IZO) is preferred since IZO can be made non-crystalline within a wide sintering temperature range, for example, of 100 to 700° C., as will be described. The durability of the obtained electro-conductive inorganic material (thin film) is also superior.

With indium zinc oxide (IZO), the electrically connecting member 28 can be formed by using a sol-gel method. Therefore, it is preferred to employ, as the starting material, a carboxylate such as indium acetate or zinc acetate, an inorganic indium compound such as zinc chloride, or an indium alkoxy compound such as indium ethoxide or zinc ethoxide.

When employing an indium zinc oxide (IZO) for forming the electrically connecting member 28, the molar ratio (represented as In/(In+Zn)) is preferably set to a value within the range of 0.5 to 0.95.

The reason is as follows. When the molar ratio of indium is smaller than 0.5, the transparency as well as the electrical conductivity may be lowered. On the other hand, if the molar ratio of indium is greater than 0.95, IZO may easily be crystallized.

Accordingly, the molar ratio (In/(In+Zn)) of indium is more preferably set to a value within the range of 0.75 to 0.90, and still more preferably set to a value within the range of 0.8 to 0.90.

The molar ratio of indium can be measured by ICP (Inductively Coupled Plasma) analysis, AES analysis (Auger Electron Spectroscopy), XPS (X-ray Photoconductor Spectroscopy) or the like.

③ Kind 3

Among the electro-conductive inorganic materials of which the electrically connecting member 28 is made, non-crystalline electro-conductive oxides are preferred as described above. Because the properties of the non-crystalline electro-conductive oxide, such as superior moisture-resistance and heat-resistance, are useful for giving good electric connection between the organic EL element and the TFT.

Superior etching property of the non-crystalline electro-conductive oxide is useful for easily forming the electrically connecting member having superior precision.

However, a crystalline structure may be partially contained in the materials of the electrically connecting member. The content of the crystalline structure, however, is preferably restricted up to 3% by weight, more preferably up to 1% by weight, and still more preferably up to 0.5% by weight.

The non-crystallinity of the constituent materials of the electrically connecting member can easily be controlled by adjusting the conditions (including the kind of a target) of a vacuum vapor deposition method or a sputtering method, as well as by adjusting or the kind or the amount of a dopant to be added. The non-crystallinity of such constituent materials can be checked by measuring the X-ray diffraction structure thereof.

Figure 10:
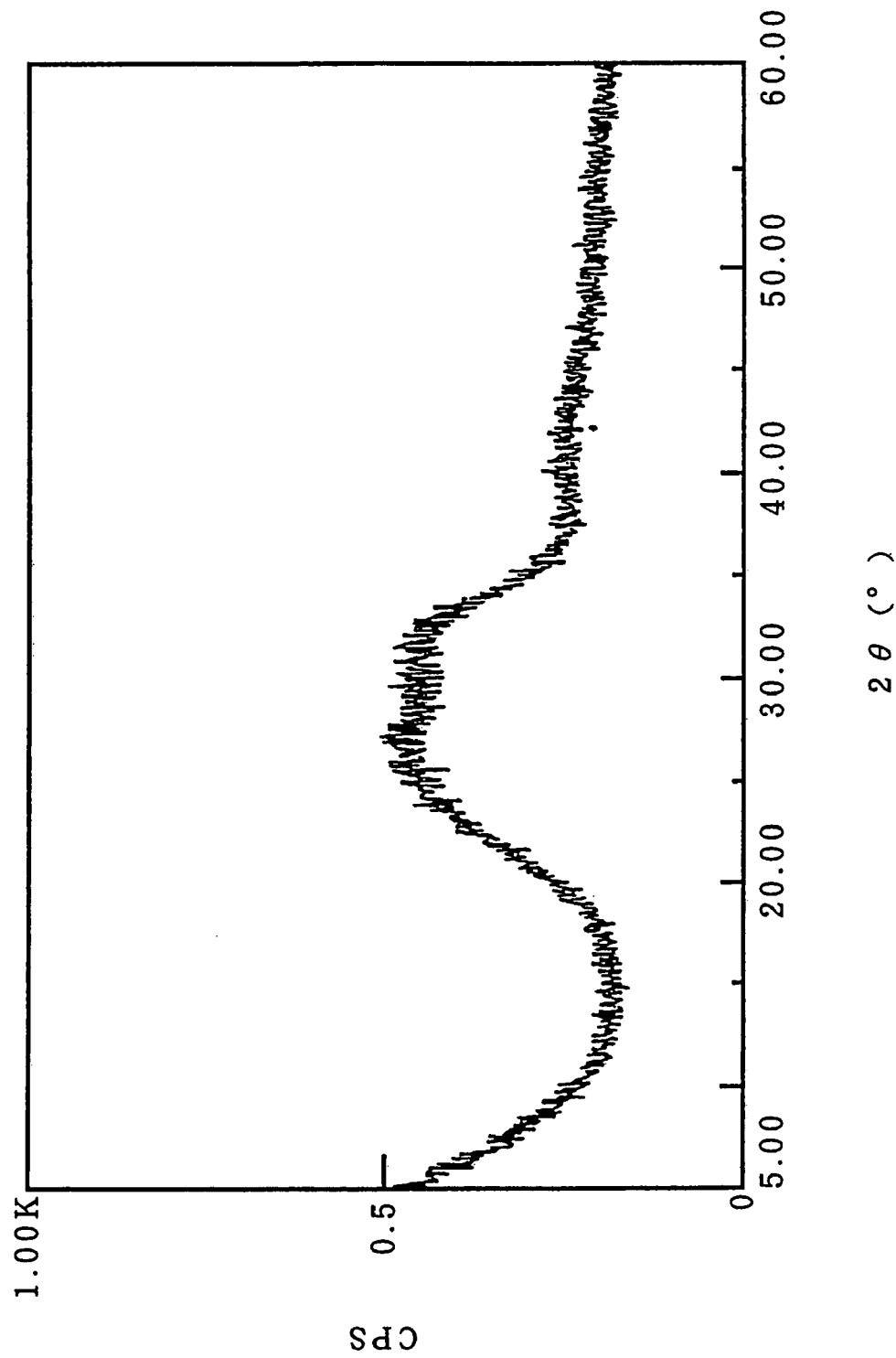
FIG. 10 is a chart showing one example of an X-ray diffraction of indium zinc oxide (IZO).

For example, FIG. 10 shows an example of X-ray diffraction chart of indium zinc oxide (IZO). From the fact that no crystal peak can be observed within the range of 5° to 60° for 2θ, it can be confirmed that the constituent material of the electrically connecting member is non-crystalline.

④ Kind 4

It is also preferred that the non-crystalline electro-conductive oxide of the electrically connecting member 28 contains a dopant. Adding the dopant makes it easy to adjust the conductivity of the non-crystalline electro-conductive oxide.

Examples of such a dopant include Sn, Sb, Ga, Ge and the like or a combination selected therefrom.

In case of a sputtering method, such a dopant should previously be mixed with a sputtering target and thereafter the sputtering target is used to perform sputtering. On the other hand, in case of a sol-gel method, it is preferred to add such a dopant as an alkoxy compound such as dimethoxy tin, trimethoxy antimony, triethoxy gallium and tetramethoxy germanium, or a chloride such as tin chloride, antimony chloride, gallium chloride and germanium chloride because such a compound can be uniformly added in the state of sol.

The added amount of the dopant is preferably set to a value within the range of 0.1 to 30% by weight of the total non-crystalline electro-conductive oxide.

The reason for this is as follows. If this added amount of the dopant is smaller than 0.1% by weight, the effect of adding may not be obtained. On the other hand, if the amount of the dopant is greater than 30% by weight, the heat-resistance or the moisture-resistance may be lowered.

Accordingly, the added amount of the dopant is more preferably set to a value within the range of 1 to 25% by weight of the total non-crystalline electro-conductive oxide, and still more preferably set to a value within the range of 10 to 20% by weight thereof.

⑤ Kind 5

Preferred examples of the organic electric conductor of which the electrically connecting member 28 is made include electro-conductive conjugated polymers, oxidant-added polymers, reductant-added polymers, oxidant-added low molecular weight substance, and reductant-added low molecular weight substance.

Examples of the oxidant added to the organic electric conductor include Lewis acids, such as iron chloride, antimony chloride and aluminum chloride. Examples of the reductant added to the organic electric conductor include alkali metals, alkali earth metals, rare earth metals, alkali compounds, alkali earth compounds, and rare earth compounds, and the like. Furthermore, examples of the electro-conductive conjugated polymer include polyaniline and derivatives thereof, polythiophene and derivatives thereof, and Lewis acid added amine compound layers, and the like.

The carbon compound is preferably amorphous carbon, graphite, or diamond-like carbon.

⑥ Resistivity

The resistivity of the material for the electrically connecting member 28 is preferably set to a value of $1\times10^{-3}$ Ω·cm or less.

The reason is that if this resistivity is greater than $1\times10^{-3}$ Ω·cm, resistance loss becomes excessively large so that the switch operation of the TFT may be obstructed.

Accordingly, the resistivity of the constituent material in the electrically connecting member is more preferably set to a value of $5\times10^{-4}$ Ω·cm or less, and still more preferably set to a value of $1\times10^{-4}$ Ω·cm or less.

⑦ Surface Resistance

The surface resistance of the electrically connecting member 28 is preferably set to a value within the range of 0.01 to 100 Ω/□.

The reason for this is as follows. If this surface resistance is smaller than 0.01 Ω/□, the kinds of the usable materials are excessively limited and further the property of electric connection to the lower electrode (transparent electrode) made of ITO, IZO or the like may be lowered. On the other hand, if the surface resistance is greater than 100 Ω/□, resistance loss becomes excessively large so that the switch operation of the TFT may be obstructed.

Accordingly, the surface resistance of the electrically connecting member is more preferably set to a value within the range of 0.1 to 20 Ω/□, and still more preferably set to a value within the range of 0.1 to 10 Ω/□.

5. Color-Converting Medium

The color-converting medium is a color filter or a fluorescent medium for emitting light having a color different from that of electroluminescence, which will be described. The color-converting medium of the present invention also includes a combination of these.

(1) Color Filter

① Structure

The color filter is provided to decompose or cut light, thereby adjusting color or improving contrast. The color filter is constituted by pigment (dye) layer made only of a pigment (dye), or a layered-product wherein a pigment (dye) is dissolved or dispersed in a binder resin.

It is preferred that the color filter contain three pigments of blue, green and red. Combining such a color filter with an organic EL element emitting white light makes it possible to give the three primary colors of light, that is, blue, green and red, thereby attaining full color display.

Like the fluorescent medium, the color filter is preferably patterned by printing method or photolithography method.

② Thickness

The thickness of the color filter is not limited so long as it sufficiently receives or absorb the luminescence of the organic EL element without disturbing color-converting function. The thickness is preferably set to a value within the range of 10 nm to 1 mm, more preferably to a value within the range of 0.5 μm to 1 mm, and still more preferably to a value within the range of 1 μm to 100 μm.

If the thickness of the color filter is 5 μm or more, the level of the lower electrode has proved to be elevated, thereby the reliability of the electric connection being lowered between the lower electrode and the TFT. Therefore, it can be said that the inclined electrically connecting member of the present invention can exhibit the effect more effectively in case that the thickness of the color filter is 5 μm or more.

(2) Fluorescent Medium

① Structure

The fluorescent medium in the organic EL display device has a function of absorbing luminescence of the organic EL element and of emitting fluorescence having a wavelength longer than the electroluminescence. The fluorescent medium is formed in the form of layered pieces which is horizontally separated from each other and arranged. The respective fluorescent medium pieces are preferably arranged corresponding to luminous areas of the organic EL elements, for example, at the cross portions of the lower electrodes and the upper electrodes. This is because the respective fluorescent medium piece is able to emit the luminescence having a color (wavelength) different from that of the incident light when the organic luminous layer at the cross portions of the lower electrodes and the upper electrodes emits light. Even if the organic element emits only blue light, it is possible to obtain three primaries (blue, green and red) by converting such blue light to red and green with the fluorescent medium. Thus, full color display is completed.

It is also preferred to arrange, between the fluorescent medium pieces, a shading layer (black matrix) for blocking off the luminescence emitted from each organic EL element and the light incident from the respective fluorescent medium piece and for improving contrast so as to reduce the dependency upon the viewing angle. This shading layer corresponds to the member 13 of FIG. 1, for example. The shading layer can be obtained by blackening the member or by making the member non light-transmissible.

The fluorescent medium may be combined with the above-described color filter in order to prevent the lowering of contrast due to outdoor daylight.

② Forming Method

In case that the fluorescent medium is mainly made of a fluorescent pigment (dye), it is preferred that the pigment film be formed by vacuum vapor deposition or sputtering method through a mask for obtaining a desired fluorescent medium pattern.

On the other hand, in case that the fluorescent medium is made of a fluorescent pigment (dye) and resin, it is preferred to subject the fluorescent pigment and the resin to mixing, dispersing or solubilizing process so as to prepare a liquid product, subsequently to make the liquid product be a film by a spin coating method, a roll coating method, a casting method or the like, and further subsequently to pattern the film into a desired pattern by a photolithography method, a screen printing method or the like.

③ Thickness

The thickness of the fluorescent medium is not limited as far as the fluorescent medium is not to thick to receive (absorb) the luminescence emitted from the organic EL element and to perform the fluorescence-generating function. For example, the thickness is preferably set to a value within the range of 10 nm to 1 mm, more preferably set to a value within the range of 0.5 μm to 1 mm, and still more preferably set to a value within the range of 1 μm to 100 μm.

If the thickness of the fluorescent medium is 5 μm or more, the reliability of the electric connection between the lower electrode and the TFT is lowered. This is the same as the case of the color filter. Therefore, the inclined electrically connecting member of the present invention can exhibit its effect more effectively only when the thickness of the fluorescent medium is 5 μm or more.

[Second Embodiment]

Figure 11:
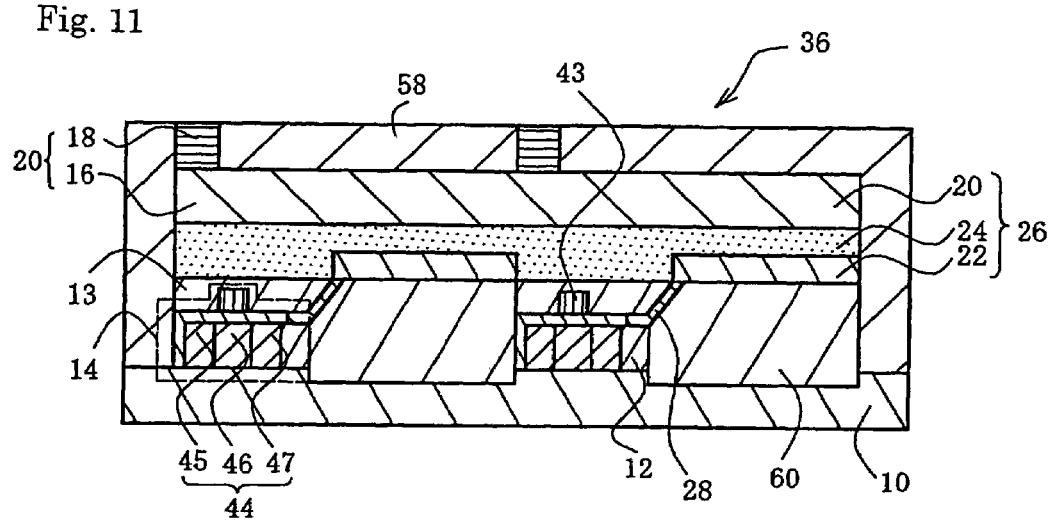
FIG. 11 is a sectional view of an active-driving type organic EL display device in a second embodiment.

As shown in FIG. 11, the organic EL display device in the second embodiment is an active-driving type organic EL display device 36 comprising a supporting substrate 10, a TFT 14 and a color-converting medium 60 formed thereon, an organic EL element 26 formed on the color-converting medium 60, an electrically connecting member 28 for connecting the TFT 14 electrically to a lower electrode 22 of the organic EL element 26, and a sealing member 58 for covering the surroundings of the organic EL element 26 and the like.

In the second embodiment, there is provided the organic EL display device wherein a part or the whole of the color-converting medium 60 is embedded in both or either of the inter-insulator (including a gate insulation film or a flattening film) 12, 13 and the supporting substrate 10.

Figure 12:
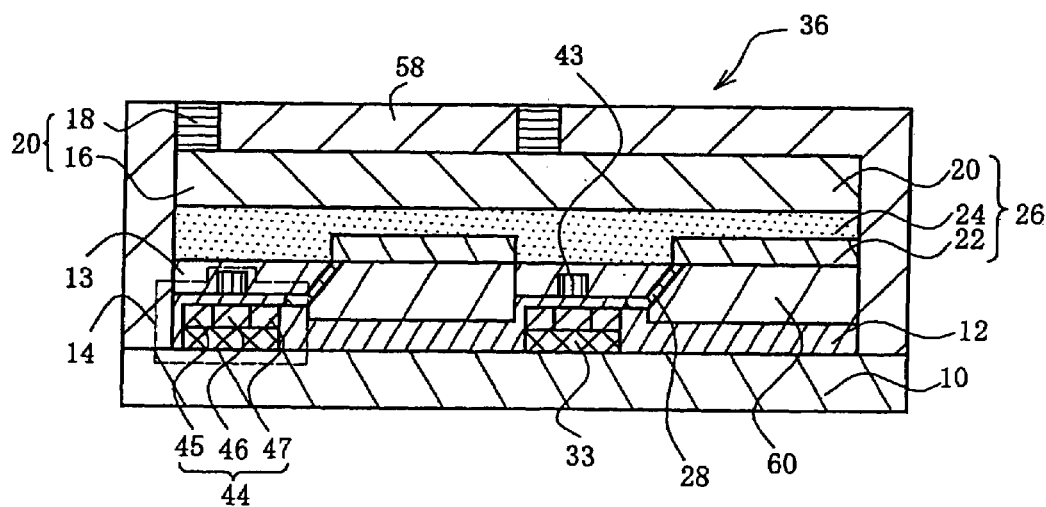
FIG. 12 is a view supplied to explain a level position adjusting layer for TFTs.
Figure 14F:
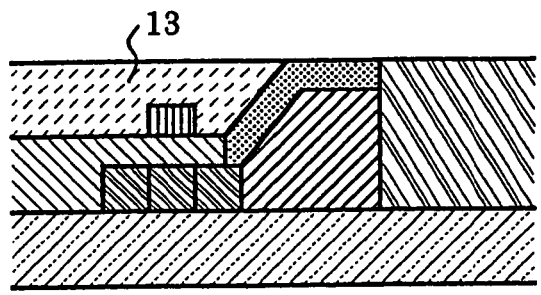
FIGS. 14(f) to 14(i) are producing step views showing the steps in the third embodiment (a second example).
Figure 14G:
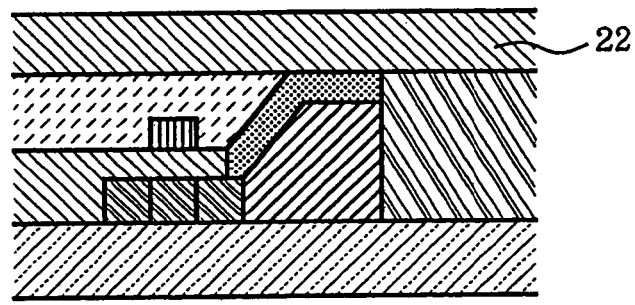
Figure 14H:
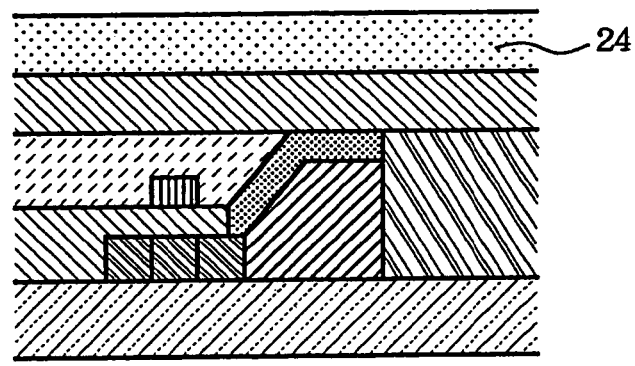
Figure 14I:
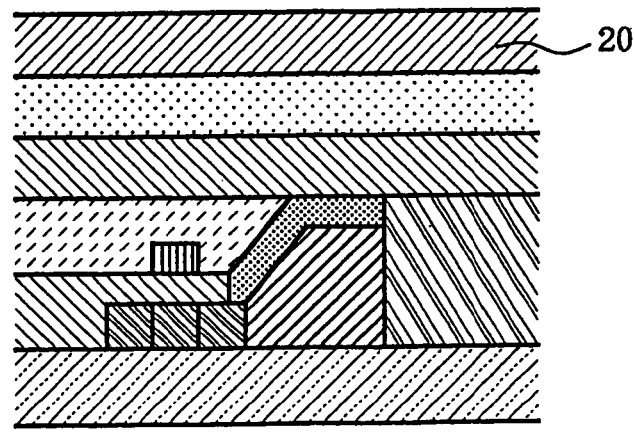

Referring to FIGS. 11 and 12, the second embodiment will be described hereinafter.

(1) Embedding Structure

As shown in FIG. 11, in the organic EL display device 36 of the second embodiment, a part of the color-converting medium 60 is preferably embedded in both or either of the inter-insulators 12, 13 and the supporting substrate 10.

Such a structure makes it possible to fix the color-converting medium 60 firmly without using any special fixing means, and to lower the level of the lower electrode 22 formed thereon.

Therefore, the handling of the color-converting medium 60 becomes easy and further a level difference between the level of the electrically connecting spot (drain electrode) in the TFT 14 and the one of the electrically connecting spot in the lower electrode 22 can be made small.

Thus, the electrically connecting member 28 can be made short, so that making electric connection becomes easy and the resistance loss in the electrically connecting member can be made small.

How much the color-converting medium is embedded should be decided based on the easiness of electric connection between the TFT and the lower electrode and the reliability of the connection. Specifically, the embedded quantity of the color-converting medium is preferably set to a value within the range of 0.1 to 20 μm.

The reason for this is as follows. If this embedded quantity is smaller than 0.1 μm, the electrically connecting member 28 is hardly made short in case that the color-converting medium is thick. On the other hand, if the embedded quantity is greater than 20 μm, it may be difficult to embed the color-converting medium.

Therefore, this embedded quantity is more preferably set to a value within the range of 0.2 to 15 μm, and still more preferably set to a value within the range of 0.3 to 10 μm.

The method of embedding the color-converting medium in the inter-insulators or the supporting substrate is not limited. It is preferred that a part of the color-converting medium be embedded, for example, by cutting or etching the corresponding spot of the inter-insulators or the supporting substrate. By forming the color-converting medium on the supporting substrate before forming the inter-insulators, it is also possible to easily embed the color-converting medium in the inter-insulators.

Although FIGS. 11 and 12 illustrate an example wherein the color-converting medium 60 is partially embedded in the inter-insulators 12 and 13, it is also preferred to embed the color-converting medium in both of the supporting substrate 10 and the inter-insulators 12 and 13. Otherwise, it is also preferable to omit the inter-insulators 12, 13 and to embed a part or the whole of the color-converting medium 60 only in the supporting substrate 10.

(2) Position Adjusting Layer

As shown in FIG. 12, in the second embodiment, a level adjusting layer 33 for adjusting the level of the TFT 14 is preferably disposed between the TFT 14 and the supporting substrate 10.

Such a structure makes it possible to elevate the level of the connection spot in the TFT 14 formed on the position adjusting layer 33 only by changing the thickness of the position adjusting layer 33. Therefore, it is possible to make small the level-difference between the level of the electrically connecting spot in the TFT 14 and the one of the electrically connecting spot (drain electrode) in the lower electrode 22, to make the electrically connecting member 28 short, and to make small the resistance loss in the electrically connecting member 28.

The thickness of the level adjusting layer should be decided based upon the easiness of the electric connection between the TFT and the lower electrode and the reliability of the connection. Specifically, the thickness of the level adjusting layer is preferably set to a value within the range of 0.1 to 20 μm.

The reason is as follows. If the thickness of the position adjusting layer is smaller than 0.1 μm, the length of the electrically connecting member 28 is hardly made short in case that the color-converting medium is thick. On the other hand, if the thickness of the position adjusting layer is greater than 20 μm, it may be difficult to form the position adjusting layer.

Therefore, the thickness of the level adjusting layer is more preferably set to a value within the range of 0.2 to 15 μm, and still more preferably set to a value within the range of 0.3 to 10 μm.

The constituent material of the level adjusting layer is not limited. The same electrically insulating material as that for the inter-insulator is preferably used. Therefore, it is preferred to use, for example, an acrylic resin, a polyimide resin, a fluorine resin, a polyolefin resin, an epoxy resin, silicon oxide ($SiO_2$), sol-gel glass, aluminum oxide ($Al_2O_3$), titanium oxide ($TiO_2$), silicon nitride ($Si_3N_4$), a glass plate or the like.

The method of forming the level adjusting layer is not limited. The layer is preferably formed, using, a vapor deposition method, a sputtering method, a printing method, an adhesion method, or a photo-curing method using a photo-curing resin as well as by means of etching or sandblasting of spots other than the position adjusting layer.

(3) Sealing Member

It is preferred that the sealing member in the organic EL display device is disposed to the periphery of the organic EL display device in order to prevent water from invading inside. Otherwise, or further, a known sealing medium, for example, drying agent, dry gas, or inert liquid such as fluoride hydrocarbon, can be inserted into a space between the organic EL display device and the sealing member fitted as described above.

For such a sealing member, the same kind of material as that for the supporting substrate, such as a glass plate or a metal plate, can be used. The form of the sealing member is not limited. The sealing member is preferably formed plated-shaped or cap-shaped, for example. In case that the sealing member is formed plate-shaped, its thickness is preferably set to a value within the range of 0.01 to 5 mm.

Furthermore, it is also preferred that a groove or the like be formed in a part of the organic EL display device and that the sealing member be injected into the groove and fixed thereto. Otherwise, it is also preferred that a photo-curing type adhesive agent or the like be used to fix the sealing member onto a part of the organic EL display device.

[Third Embodiment]

The third embodiment relates to a method for producing the organic EL display device 30 of the first embodiment, illustrated in FIG. 1. The third embodiment is specifically a method of producing the active-driving type organic EL display device 30 comprising, the TFT 14 embedded in the inter-insulator 12 formed on the supporting substrate 10, the organic EL element 26 formed on the inter-insulator 12 and including the organic luminous medium 24 sandwiched between the upper electrode 20 and the lower electrode 22, and the electrically connecting member 28 for electrically connecting the TFT 14 to the organic EL element 26.

In the third embodiment, as shown in FIGS. 13(*a*) to 13(*e*), FIGS. 14(*f*) to 14(*i*) and FIGS. 15(*a*) to 15(*i*), there is provided a method for forming the organic EL display device 30 comprising the steps of forming the TFT 14, forming the inclined electrically connecting member, and forming the organic EL element 26.

Hereinafter, referring to these figures and others, the characteristic parts of the third embodiment will be described.

(1) Step of Forming a Thin Film Transistor (TFT)

Referring to FIGS. 15(*a*) to 15(*i*), the step of forming a TFT (the steps of producing an active matrix substrate) will be described.

① Forming an Active Layer

As shown in FIG. 15(*a*), an α-Si layer 70 is first deposited on the supporting substrate 10 in a manner such as low pressure chemical vapor deposition, LPCVD).

The thickness of the α-Si layer 70 is preferably set to a value within the range of 40 to 200 nm. The substrate 10 is preferably a crystalline material such as quartz, and is more preferably low-expandable glass. In case that a low-expandable glass substrate is used, a production process is carried out at a low temperature, preferably up to 1000° C., more preferably up to 600° C. in order to avoid the melting or strain of the glass substrate throughout the production process or avoid the dopant's out-diffusion into active regions.

Next, as shown in FIG. 15(*b*), an excimer laser such as a KrF (248 nm) laser is radiated onto the α-Si layer 70 to perform annealing crystallization thereby obtaining polysilicon (see SID '96, Digest of technical papers, pp. 17–28).

Referring to the annealing conditions for this excimer laser, the temperature of the substrate is preferably set to a value within the range of 100 to 300° C. In addition, the dose of the excimer laser is set to a value within the range of 100 to 300 $mJ/cm^2$, respectively.

Next, as shown in FIG. 15(*c*), the polysilicon crystallized by the annealing is patterned into an island form by photolithography. $CF_4$ gas is preferably used for the etching gas since superior resolution can be obtained.

Next, as shown in FIG. 15(*d*), an insulator gate material 72 is deposited on the surfaces of the island-patterned polysilicon 71 and the substrate 10 by chemical vapor deposition (CVD) or the like, so as to prepare a gate oxide insulator layer 72.

This gate oxide insulator layer 72 is preferably made of silicon dioxide so that chemical vapor deposition (CVD) such as plasma enhanced CVD (PECVD) or low pressure CVD (LPCVD) can be applied to the layer 72.

The thickness of the gate oxide insulator layer 72 is preferably set to a value within the range of 100 to 200 nm.

The temperature of the substrate preferably ranges from 250 to 400° C. In order to obtain an insulator gate material of a higher quality, it is preferred that annealing treatment be conducted at 300 to 600° C. for about 1 to about 3 hours.

Next, as shown in FIG. 15(*e*), a film of a gate electrode 73 is formed by vapor deposition or sputtering. Preferred examples of the material for the gate electrode 73 include TaN and Al and the like. The thickness thereof is preferably set to a value within the range of 200 to 500 nm.

Next, as shown in FIGS. 15(f) to 15(h), the gate electrode 73 is patterned and thereafter anodic oxidization is performed. When an Al gate is used, the anodic oxidization is preferably performed two times to complete insulation, as shown in FIGS. 15(f) to 15(h). The method of the anodic oxidization could be the same as those can be made to the same content as disclosed in Japanese Patent Application Publication No. 8-15120.

Next, as shown in FIG. 15(i), an n+ doped region or a p+ doped region is formed by ion doping (ion implantation), thereby forming an active layer for a source and a drain. In order to perform the ion doping effectively, it is preferred to introduce nitrogen gas during the ion doping and to heat treatment at 200 to 400° C. for 1 to 10 hours.

The gate electrode 73 is preferably made of polysilicon obtained from α-silicon. Namely, after the polysilicon gate electrode 73 is formed on the gate insulation layer, the resultant product is subjected to ion-implantation with an n-type dopant such as arsenic. Subsequently, the resultant product is patterned into an island form by photolithography in such a manner that source regions and drain regions can be formed in the polysilicon region.

The above-described gate electrode 73 can be supplied as a scanning electrode and/or a bottom electrode of a condenser.

② Forming Signal Electrode Lines and Common Electrode Lines

After an electric insulation layer, for example, an SiO layer, is formed on the active layer (not shown) by ECRCVD (electron cyclotron resonance chemical vapor deposition), signal electrode lines and common electrode lines (which may be referred to wiring electrodes) are formed and electrically connected to each other. Specifically, of the following steps are conducted: forming signal electrode lines and common electrode lines; forming upper electrodes of condensers; connecting electrically the source of the second transistor (Tr2) 56 to the common electrode line; connecting electrically the drain of the first transistor (Tr1) 55 to the signal electrode line.

Together with performing these steps, it is preferred to form metal lines made of Al alloy, Al, Cr, W, Mo or the like by a photolithography method and further to form contacts such as the drains and the sources of the first transistor (Tr1) 55 and the second transistor (Tr2) 56 by a vapor deposition method, a sputtering method or the like with openings of the electric insulation layer deposited on the side of the surfaces of the contacts being inclined by etching.

③ Forming an Inter-Insulator

At the next stage, an inter-insulator made of silicon dioxide ($SiO_2$), silicon nitride ($Si_3N_4$), polyimide or the like is formed on the whole of the active layer and the electric insulation layer thereon.

The electric insulation film made of silicon dioxide can be obtained by a PECVD method under the substrate temperature of 250 to 400° C. with supplying TEOS (tetraethoxysilane), for example.

The inter-insulator can also be obtained by ECRCVD method under the substrate temperature of 100 to 300° C.

However, it generally takes much time to make flat these inorganic insulator film. It is therefore preferred to form an inter-insulator made of an organic material.

(2) Step of Forming an Electrically Connecting Member

① Forming Method 1

The electrically connecting member is preferably formed with a thin film forming method, that is, both or either of a vacuum vapor deposition method and a sputtering method.

Because an electrically connecting member can easily be obtained with having a uniform thickness even if the electrically connecting member is formed in an inclined state.

The electrically connecting member composed of the such a thin film is superior in durability, thereby giving superior connection reliability even if the member is heated or vibrated.

Conditions for the vacuum vapor deposition method and the sputtering method are not limited. In case that the electrically connecting member is made of IZO with a DC sputtering method, the preferable conditions are as follows: 0.1 to 5 Pa for sputtering gas pressure, 0.1 to 10 $W/cm^2$ for electric power, 5 to 100 nm/minute for film-depositing rate, and 50 to 200° C. for the temperature of a sputtering face.

② Forming Method 2

It is also preferred to form the electrically connecting member by sintering an electro-conductive paste.

If the electrically connecting member is an electrical wiring composed of the sintered substance of the electro-conductive paste, the electrically connecting member can be formed only by applying the paste to the inclined portion and thereafter heating the paste. The electro-conductive paste has good adhesion to the lower electrode and the TFT, so that good electric connection properties can be obtained.

Furthermore, a side of the color-converting medium can be used for supporting the electrically connecting member so that the inclined electrically connecting member can easily be disposed. Moreover, the durability of the electrically connecting member can be improved.

Sintering conditions of the electro-conductive paste are not limited. For example, it is preferred to print the electro-conductive paste in predetermined positions and thereafter to heat the paste at 80 to 300° C. under the non-oxygen gas for 5 minutes to 20 hours thereby forming the electrically connecting member.

The kind of the electro-conductive paste is not limited. For example, the paste can be composed by adding, to a thermosetting resin such as epoxy resin or phenol resin, powder of a metal such as Al, Pt, Au, Ag, Cu, Ni or solder, as well as an electro-conductive inorganic material such as IZO, $In_2O_3$ or $SnO_2$ as an electro-conductive material, together with a plasticizer or the like as a viscosity adjuster.

③ Forming Method 3

Figure 16:
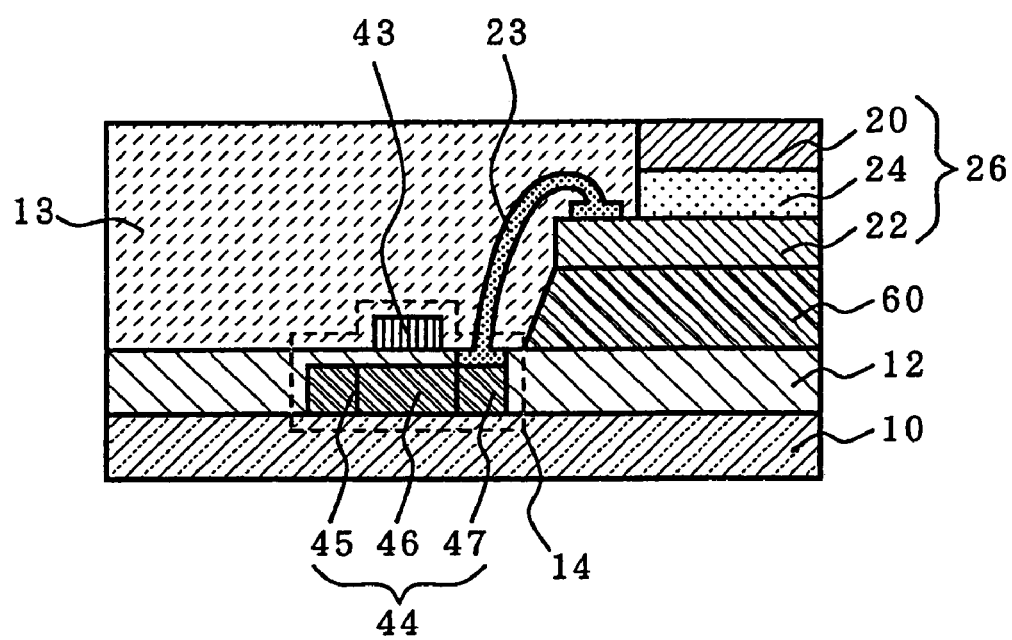
FIG. 16 is a view showing a modified example (a bonding wire) of the electrically connecting member.

As shown in FIG. 16, the electrically connecting member 23 is preferably formed by wire bonding method.

Even if a level-difference based on the color-converting medium 60 or the like has occurred between the TFT 14 and the lower electrode 22 as a transparent electrode, the TFT can easily be connected to the lower electrode 22 only by adjusting the length of the bonding wire. For example, in case that the thickness of the color-converting medium is t (μm), by the bonding wire 1.2t to 3t (μm) long, the TFT can easily be connected to the lower electrode and further superior connection reliability can be obtained.

A preferred kind of the material for the bonding wire is Al, Au, Cu or the like. Because precise electric connection can be obtained between the lower electrode and the TFT. The resistance loss is also small.

④ Forming Method 4

Figure 17:
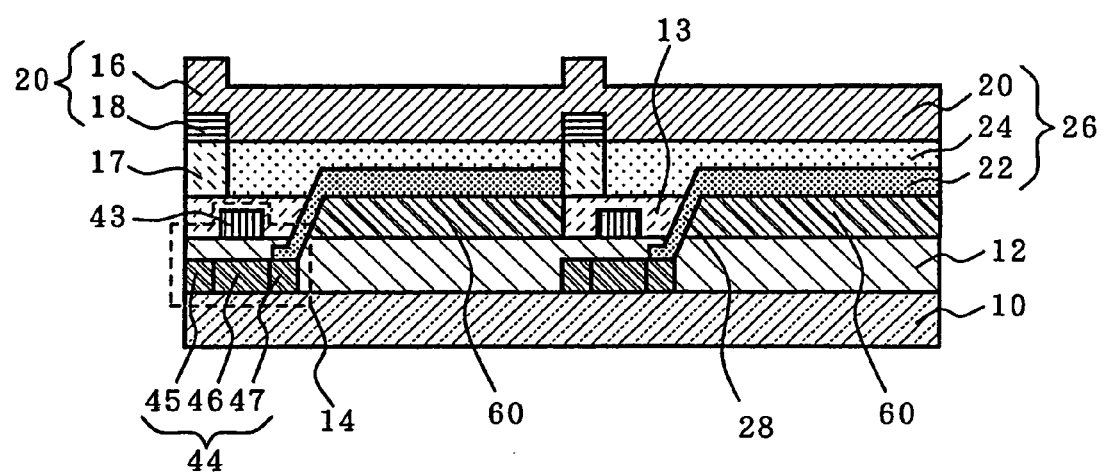
FIG. 17 is a view showing a modified example (integrally formed) of the electrically connecting member.
Figure 18:
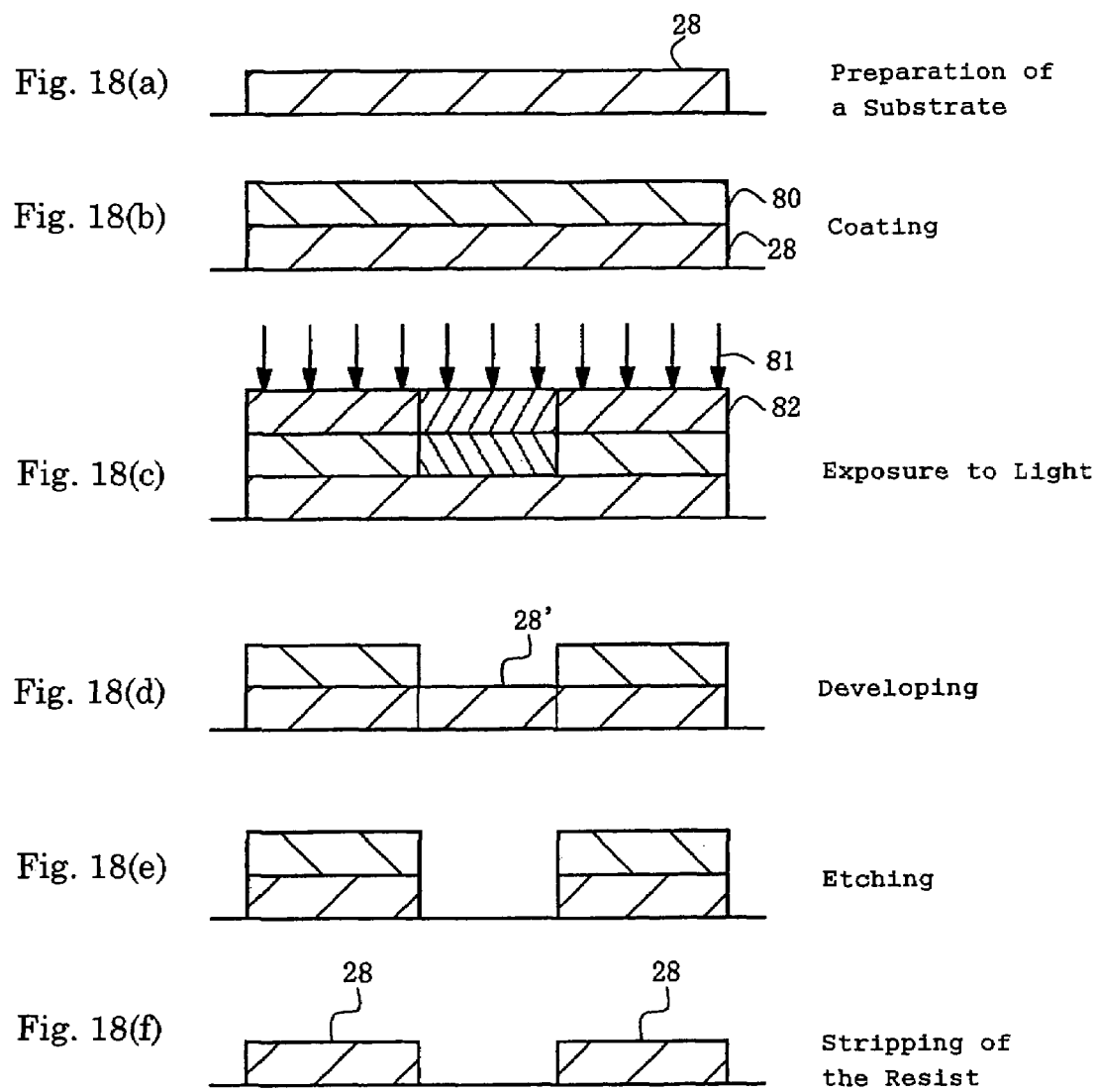
FIGS. 18(a) to 18(f) are views showing one example of etching steps of the electrically connecting member.
Figure 19:
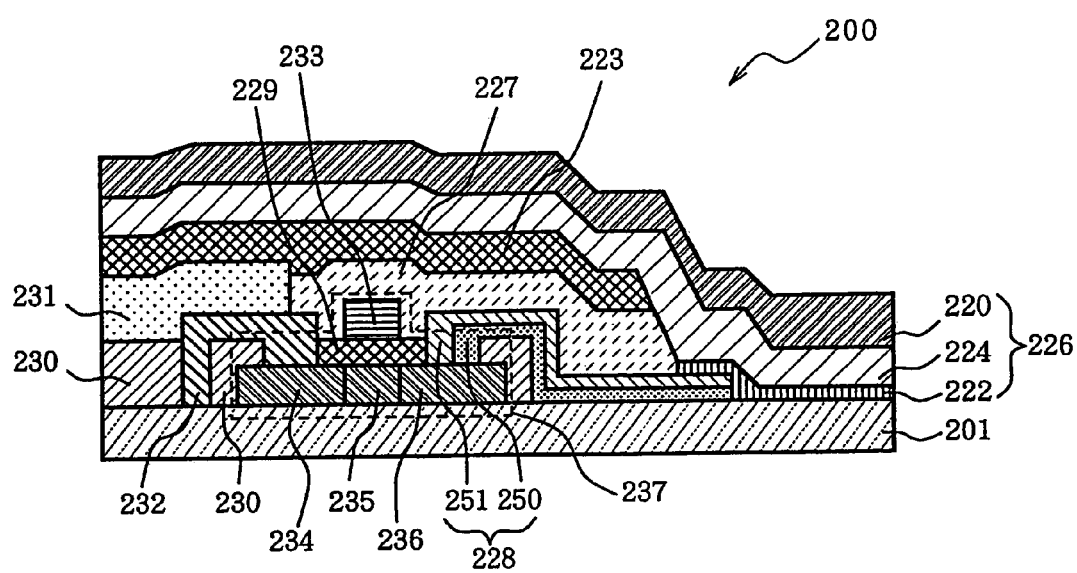
FIG. 19 is a sectional view of a conventional active-driving type organic EL display device (a first example).

As shown in FIG. 17, it is preferred to form the electrically connecting member 28 integral with the lower electrode 22. It will be confirmed in FIG. 17 that no seam is drawn between the electrically connecting member 28 and the lower electrode 22.

Consequently, it is possible to reduce the number of the electrically connection spots and to obtain the electrically connecting member having better connection reliability.

In order to form the electrically connecting member integral with the lower electrode, it is preferred to adopt a sputtering method. It is also preferred to adopt a sol-gel method, which will be described later, using a non-crystalline electro-conductive oxide.

⑤ Forming Method 5

As aforementioned, it is still preferred to form the electrically connecting member by a sol-gel method. Specifically, a raw material solution of an indium zinc oxide is coated and then converted with heat to a gel for preparing material of the electrically connecting member. Subsequently, the gel is patterned with a photolithography method, thereby producing the electrically connecting member.

Using this sol-gel method, it is easy to form the electrically connecting member made of a non-crystalline electro-conductive oxide. Such an electrically connecting member can be obtained without using any special forming device. That is, it is obtained only by applying the raw material solution onto a predetermined position and thereafter heating (sintering) as well as reducing the applied solution. Since sintering temperature or reducing temperature is relatively low, thermal damage is hardly given to the other constituent members. Therefore, an organic element EL can be formed before the electrically connecting member is formed.

The heating (sintering) condition for the gelation is not limited. For example, heating is preferably executed at 100 to 700° C. for 5 minutes to 20 hours, and more preferably at 250 to 500° C. for 5 minutes to 20 hours.

The reason is as follows. If the heating temperature is slower than 100° C., the gelation may be insufficient. On the other hand, if the heating temperature is higher than 700° C., a crystal portion is apt to be formed.

Furthermore, the condition for the reduction is not limited. For example, it is preferred to heat at 100 to 700° C. for 5 minutes to 20 hours and to reduce with such a reducing gas as hydrogen, nitrogen or argon. Heating is more preferably executed at 250 to 500° C. for 5 minutes to 20 hours.

⑥ Forming Method 6

It is preferred that the electrically connecting member be made of a non-crystalline electro-conductive oxide and that the oxide is etched with an organic acid to form a pattern. Specifically, as shown in FIGS. 18(a) to 18(f), photolithography method is used to form a resist film 80 on a non-crystalline electro-conductive oxide 28 (FIGS. 18(a) and 18(b)). Subsequently, the resist film 80 is exposed to light 81 through a photo mask 82 (FIG. 18(c)). A part 28' of the non-crystalline electro-conductive oxide is then revealed by developing (FIG. 18(d)). Succeedingly, the part 28' is etched with an organic acid so as to be patterned (FIG. 18(e)). Finally, the resist film 80 is stripped so that the electrically connecting member 28 is revealed (FIG. 18(f)).

Even if such a metal material as Al or Cr is used for a part of the TFT or the organic EL element, only the non-crystalline electro-conductive oxide is etched without corroding such a metal material. Thus, the electrically connecting member 28 can be formed precisely. Furthermore, metal migration and the like can easily be prevented.

Even in case that the electrically connecting member is made of the non-crystalline electro-conductive oxide, in order to make etching rate high, it is preferred to use a phosphoric acid based etchant or a hydrochloric acid based etchant besides the organic acid.

Preferred examples of the organic acid include oxalic acid, acetic acid, and citric acid. Among others, oxalic acid or acetic acid is preferred since etching the non-crystalline electro-conductive oxide can be executed precisely.

For an etching solution, it is preferred to use, the organic acid dissolved in water, an alcohol solvent, or a polar solvent or the like. Employing such a solvent makes it possible to etch the non-crystalline electro-conductive oxide more precisely.

In this case, it is preferred to set the concentration of the organic acid to a value within the range of 0.1 to 50% by weight. The reason for this is as follows. If the concentration of the organic acid is smaller than 0.1% by weight, the rate of etching the non-crystalline electro-conductive oxide may be significantly lowered. On the other hand, if the concentration of the organic acid is greater than 50% by weight, the metal material such as Al or Cr may be corroded.

Therefore, the concentration of the organic acid is more preferably set to a value within the range of 1 to 30% by weight, and still more preferably set to a value within the range of 3 to 20% by weight.

Although the temperature of the etching is not limited, it is preferable to set a temperature within the range of 20 to 100° C. The reason for this is as follows. If the etching temperature is lower than 20° C., the rate of etching the non-crystalline electro-conductive oxide may be significantly lowered. On the other hand, if the etching temperature is higher than 100° C., the metal material such as Al or Cr may be corroded.

Therefore, the etching temperature is more preferably set to a temperature within the range of 25 to 80° C., and still more preferably set to a temperature within the range of 30 to 60° C.

(3) Step of Forming an Organic EL Element

As shown in FIGS. 13(a) to 13(e) and FIGS. 14(f) to 14(i), an organic EL element can be formed in sequence of the following steps: (i) the TFT 14 and the inter-insulator (including the oblique member and/or the flattening film) 63 or 13 are formed; (ii) successively formed are the color-converting medium 60, the electrically connecting member 28, the lower electrode (anode) 22, the inter-insulator (not shown), and the organic luminous medium 24 (the organic luminous layer, the hole injection layer, the electron injection layer and the like); (iii) the upper electrode (cathode) 20 is formed.

The color-converting medium 60 is preferably formed by a vacuum vapor deposition method, a sputtering method, a photolithography method, an ink-jet method, a screen printing method, a micelle disruption method, or the like.

The lower electrode 22 or the upper electrode 20 is preferably formed by such a method capable of forming a film in a dry state as a vacuum vapor deposition method or a sputtering method.

Furthermore, the organic luminous medium 24 is preferably formed by a vacuum vapor deposition method, a sputtering method, a spin coating method, the Langumuir-Blodgett method (LB method), an ink-jet method, a micelle disruption method, or the like.

The above-described method or the order of forming the organic EL element can be appropriately varied within the scope of the objects of the present invention.

For example, the oblique member or the flattening film may be formed after the color-converting medium 60 is formed. Alternatively, the inter-insulator 13 may be formed at the same time when the oblique member or the flattening film is formed.

Since the drain portion in the TFT 14 may be eroded or contaminated when the color-converting medium 60 is formed, it is preferred to use the inter-insulator to protect the drain portion until the electrically connecting member 28 is formed. When the electrically connecting member 28 is connected electrically to the drain portion, it is preferred to etch the inter-insulator so as to form an opening.

(4) Sealing Step

Concerning the sealing step, it is preferred to form the organic EL element, to connect this organic EL element electrically to the TFT, and to fix these elements by covering these elements with a sealing member.

It is also preferred to insert a sealing gas into a space between the sealing member and the organic EL element and the like.

Furthermore, if water is contained in the organic luminous medium, the inter-insulators, the gate insulation film and the like, this water may induce the dark spots or the like to be generated in the organic EL element after sealing. Therefore, the water content in these organic materials is preferably set to a value of 0.05% or less by weight.

In case that a DC voltage is applied to the organic EL element, luminescence can be observed when the anode and the cathode are set to the polarities of + and −, respectively. The applied voltage should be 5 to 40 V. It is therefore preferred to drive the organic EL element before the sealing step and to judge the quality of the deposited film of the organic EL element.

EXAMPLE

Hereinafter, examples of the present invention will be described along production and evaluation of an organic EL display device for conversion into red luminescence.

However, organic EL display devices for conversion into other luminescence colors (blue, green and like) can be realized, and multi-colorization or full colorization can be carried out by arranging different color-converting media two-dimensionally in respective pixels.

Example 1

(1) Production of an Organic EL Display Device

① Formation of TFTs

Polysilicon TFTs as shown in FIG. 1 were formed on a glass substrate (OA2 glass, made by Nippon Electric Glass Co., Ltd.) having a length of 112 mm, a width of 143 mm and a thickness of 1.1 mm along FIGS. 15(*a*) to 15(*i*).

At this time, aluminum was used to form gate electrodes, scanning electrodes, and bottom electrodes of condensers, and further a dopant was added to silicon regions corresponding to sources and drains of the TFTs, so as to form $n^+$ type regions.

Next, an inter-insulator ($SiO_2$) was formed on the resultant active layer by CRCVD method, so as to have a thickness of 500 nm. Thereafter, as shown in FIG. 4, aluminum was used to form signal electrode lines, common electrode lines, and upper electrodes of the condensers. Furthermore, electric connection between the source electrode of each second transistor (Tr2) and the common electrode and electric connection between the drain of each first transistor (Tr1) and the signal electrode were performed.

Electric connection between each TFT and each electrode was appropriately performed by subjecting the inter-insulator $SiO_2$ to wet etching with hydrofluoric acid and using the thus-opened via holes.

② Formation of a Color-Converting Medium

Next, a red color filter material (V259R: anthraquinone type pigment-containing acrylate type resist, made by Nippon Steel Chemical Co., Ltd.) was applied onto the inter-insulator ($SiO_2$) by spin coating. After drying, spots corresponding to portions adjacent to the TFTs in pixels were exposed to ultraviolet rays, and then developed with 2.38% by weight TMAH (tetramethyl ammonium hydroxide). Thereafter, the resultant product was subjected to post-baking in an oven at 220° C. for 10 minutes, so as to form a red color filter (film thickness: 1.0 μm).

Next, coumarin 6: 0.53 g, Basic Violet 11: 1.5 g, rhodamine 6G: 1.5 g, and an acrylate type resist (V259PA, the concentration of solid: 50%, made by Nippon Steel Chemical Co., Ltd.): 100 g were uniformly dissolved to prepare an ink for a red fluorescent medium. This ink was applied onto the substrate, on which the red color filter was previously formed, by spin coating. After drying, portions corresponding to the red color filter were exposed to ultraviolet rays in the state that a gap of 500 μm was made between a photo mask and the substrate. The exposed product was developed with the above-described 2.38% by weight TMAH. Thereafter, the product was subjected to post-baking in an oven at 180° C. for 10 minutes, so as to form a red fluorescent medium (film thickness: 8 μm).

In the color-converting medium composed of the thus formed red color filter and red fluorescent medium, the gap was made between the photo mask and the substrate when the exposure. Therefore, the end of the color-converting medium pieces was developed and tapered by diffraction of the light. As a result, the angle made between the side of the color-converting medium pieces and the substrate along the plane direction was 45°. Thus, it is possible to use the end of the color-converting medium pieces as an oblique member.

③ Formation of Electrically Connecting Members

Next, opening portions in the inter-insulator ($SiO_2$) were made along the end of the color-converting medium pieces by etching method. Electrically connecting members were formed through the opening portions (inclination angle: 45°) to attain connection to drains of the second transistors (Tr2). In other words, oblique ends of the color-converting medium pieces were used to deposit the electrically connecting members made of Al and having a thickness of 100 nm into the whole opening portions by vapor deposition method. Next, photolithography method was used to form a pattern.

④ Formation of Anodes (Lower Electrodes)

An IZO film having a film thickness of 200 nm was deposited on the whole of the surface by sputtering method. A positive resist HPR204 (made by Fuji-Hunt Electronics Technology Co., Ltd.) was applied onto this IZO film by spin coating. The resultant product was exposed to ultraviolet rays through a photo mask for giving dotted pattern as pixels, developed with TMAH as a developing solution, and subjected to post-baking treatment.

Next, an aqueous oxalic acid solution (concentration: 5% by weight) was used as an etchant to etch the IZO film. An stripping solution 104 (made by Tokyo Ohka Kogyo Co., Ltd.) was used to remove the positive resist, thereby forming a dotted IZO pattern as anodes (lower electrodes), and attaining electric connection between the anodes and the electrically connecting members (Al).

⑤ Formation of an Inter-Insulator

Next, the above-described acrylate type resist was applied onto the IZO pattern as pixels by spin coating, and subsequently the resultant product was exposed to ultraviolet rays through a photo mask for covering the edge of the IZO pattern and TFTs. Thereafter, TMAH was used as a developing solution to develop the product, and further the developed product was subjected to baking treatment at 180° C. so as to be made to a TFT substrate having an inter-insulator.

⑥ Dehydrating Step

The resultant TFT substrate was cleaned with isopropyl alcohol and ultraviolet rays, and then moved to a dehydrating unit for performing a dehydrating step. That is, the TFT substrate was put in a dry box having an inert gas (nitrogen) circulating section, a dew point controlling section, and a heating device section (hot plate).

The hot plate was used to heat the substrate in the dry box up to 80° C. While dry nitrogen was introduced thereto in this state, the dew point was lowered to −50° C. The TFT substrate was allowed to stand still for about 2 hour, to remove water in the color-converting medium and the inter-insulator and water adhering to the surface of the glass substrate and the like.

⑦ Formation of an Organic Luminous Medium

The heating by the hot plate was stopped so that the temperature of the glass substrate was lowered to room temperature. Thereafter, the TFT substrate was fixed onto a substrate holder inside a vacuum vapor deposition machine (made by ULVAC Co., Ltd.) without exposing the substrate to the air and with keeping the dew point.

The following materials were filled into a heating boat made of molybdenum inside the vacuum vapor deposition machine.

Hole injection material: 4,4',4"-tris[N-(3-methylphenyl)-N-phenylamino]triphenylamine (MTDATA), and 4,4'-bis[N-(1-naphthyl)-N-phenylamino]-biphenyl(NPD), Organic luminous material (host): 4,4'-bis(2,2-diphenylvinyl)biphenyl (DPVBi), Organic luminous material (dopant): 1,4-bis[4-(N,N-diphenylaminostyrylbenzene)] (DPAVB), Electron injecting material: tris(8-quinolinol)aluminum (Alq).

As an upper electrode (cathode) material, Al—Li alloy (Li concentration: 10% by atom) was fitted onto a filament made of tungsten.

Next, the evacuated pressure in the vacuum vapor deposition machine was reduced to $665 \times 10^{-7}$ Pa ($5 \times 10^{-7}$ Torr), and an organic luminous medium and the like were formed by deposition based on evacuating one time, without breaking the vacuum state from the formation of a hole injection layer to the formation of cathodes, in such a manner that the following vapor deposition rate and thickness would be obtained. The host material (DPVBi) and the dopant material (DPAVB) of the organic luminous materials were simultaneously evaporated.

MTDATA: vapor deposition rate=0.1 to 0.3 nm/sec., thickness=60 nm,

NPD: vapor deposition rate=0.1 to 0.3 nm/sec., thickness=20 nm

DPVBi: vapor deposition rate=0.1 to 0.3 nm/sec.,

DPAVB: vapor deposition rate=0.03 to 0.05 nm/sec., total thickness=50 nm

Alq: vapor deposition rate=0.1 to 0.3 nm/sec., thickness=20 nm

Al—Li: vapor deposition rate=0.5 to 1.0 nm/sec., thickness=150 nm

⑧ Sealing Step

Next, a sealing glass substrate (soda-lime glass, made by Geomatic Co., Ltd.) was deposited on the side of the cathodes inside a sealing unit into which dry nitrogen was introduced, and then the surrounding thereof was sealed with a photocuring adhesive agent TB3102 (made by Three Bond Co., Ltd.), to produce an organic EL display device as shown in FIG. 1.

(2) Evaluation of the Organic EL Display Device

① Measurement of Luminescence Performance

A DC voltage of 7 V was applied between the lower electrodes (IZO pattern, anodes) and the upper electrodes (cathodes), through the scanning electrodes, the signal electrodes, and the common electrodes, in the resultant organic EL display device to cause respective pixels (about 230,000 pixels), which were portions where the respective electrodes crossed each other, to emit light. A Chroma meter CS100 (made by Minoluta Co., Ltd.) was used to measure the luminescence brightness so that a value of 100 cd/m$^2$ was obtained.

The CIE chromaticity thereof was measured. As a result, it was confirmed that red luminescence whose CIEx was 0.65 and whose CIEy was 0.35 in the CIE chromaticity coordinates was obtained.

② Durability Test

Next, the resultant organic EL display device was continuously driven at room temperature for two weeks. As a result, the dispersion of the luminescence brightness in the pixels was within ±10%. Thus, it was confirmed that stable display was kept at a low voltage.

Example 2

(1) Production of an Organic EL Display Device

In Example 2, oblique members were set separately from a color-converting medium and further the inclination angle of electrically connecting members was set to 45°. In this way, an organic EL display device was produced.

That is, TFTs and a red color filter as a color-converting medium were formed in the same way as in Example 1. Next, coumarin 6: 0.53 g, Basic Violet 11: 1.5 g, rhodamine 6G: 1.5 g, and an acrylate type resist (V259PA, the concentration of solid: 50%, made by Nippon Steel Chemical Co., Ltd.): 100 g were uniformly dissolved to prepare an ink for a red fluorescent medium. This ink was applied onto the substrate, on which the red color filter was formed, by spin coating. Furthermore, portions corresponding to the red color filter were exposed to ultraviolet rays in the state that no gap was made between a photo mask and the substrate. The exposed product was then developed with the above-described 2.38% by weight TMAH. Furthermore, the product was subjected to baking at 180° C., so as to form a red fluorescent medium (film thickness: 8 μm). At this time, in the color-converting medium, no gap was made between the photo mask and the substrate in the process of the exposure. Therefore, diffraction of the light was not caused so that the end of the color-converting medium pieces was made perpendicular. As a result, the angle made between the side of the color-converting medium pieces and the substrate was about 90°.

Next, an acrylate type resist (V259PA) was applied onto the resultant product by spin coating, and the product was exposed to ultraviolet rays to form a pattern in which opening portions were made only in drain regions of the second transistors (Tr2). The product was then developed with 2.38% by weight TMAH and baked at 180° C. to form oblique members (which may be referred to flattening films, film thickness: 2 μm). That is, oblique parts wherein the angle made between the side of the color-converting medium pieces and the substrate along the plane direction was 45° were made.

Next, electrically connecting members (the inclination angle of the electrically connecting members was 45°), lower electrodes, organic EL element and the like were formed in the same way as in Example 1. Thus, an organic EL display device as shown in FIG. 6 was produced.

(2) Evaluation of the Organic EL Display Device

The resultant organic EL display device was evaluated in the same way as in Example 1. In other words, about luminescence performance, the luminescence brightness was 98 cd/m$^2$ under the application of a DC voltage of 7 V, and the CIE chromaticity was as follows: CIEx=0.65, and CIEy=0.35. Thus, red luminescence was obtained.

An durability test was performed in the same way as in Example 1. As a result, the luminescence brightness of the respective pixels was uniform (within ±10%). It was confirmed that stable display was kept at a low voltage.

Example 3

(1) Formation of an Organic EL Display Device

In Example 3, oblique members which also functioned as a black matrix were set separately from a color-converting medium and further the inclination angle of electrically connecting members was set to 80°. In this way, an organic EL display device was produced.

That is, in the same way as in Example 1, TFTs were formed and subsequently an acrylate type resist (V259BK, made by Nippon Steel Chemical Co., Ltd.) containing a black pigment was applied onto the TFT substrate by spin coating. Next, the resultant product was exposed to ultraviolet rays through a photo mask so as to form a pattern which opening portions were made in drain regions of the second transistors (Tr2) and the corresponding portions of the color-converting medium. Furthermore, the resultant product was developed with 2.38% by weight TMAH, and then baked at 220° C. As a result, the resist was insufficiently photo-cured because the resist was black. Thus, the pattern flowed so that oblique members (peak film thickness: 10 μm) which also functioned as a black matrix and had tapered edges were formed. The angle made between the side of the oblique members and the substrate was 80°.

Next, a color-converting medium was made under the same conditions as in Example 1, and further IZO electrodes (anodes) which functioned as electrically connecting members and lower electrodes were formed. At this time, the inclination angle of the electrically connecting members (angle thereof to the substrate) was 80°.

Next, in the same way as in Example 1, lower electrodes, organic EL elements, and the like were formed. In this way, an organic EL display device as shown in FIG. 6 or 17 was produced.

(2) Evaluation of the Organic EL Display Device

The resultant organic EL display device was evaluated in the same way as in Example 1. In other words, about luminescence performance, the luminescence brightness was 95 cd/m$^2$ under the application of a DC voltage of 7 V, and the CIE chromaticity was as follows: CIEx=0.65, and CIEy=0.35. Thus, red luminescence was obtained.

An durability test was performed in the same way as in Example 1. As a result, the luminescence brightness of the respective pixels was uniform (within ±10%). It was confirmed that stable display was kept at a low voltage.

Furthermore, it was confirmed that the presence of the black matrix caused colors not to spread between pixels and caused the contrast of display to be improved.

Example 4

(1) Formation of an Organic EL Display Device

In Example 4, the inclination angle of electrically connecting members was set to 10°. In this way, an organic EL display device was produced. That is, an organic EL display device as shown in FIG. 1 was produced under the same conditions as in Example 1 except that only a red color filter (film thickness: 1.0 μm) was used as a color-converting medium, and a white luminescence organic EL element obtained by co-evaporating rubrene (vapor deposition rate: 0.03 nm/sec.) was used as the dopant of the organic luminous material. In the resultant organic EL display device, the inclination angle of the electrically connecting members (angle thereof to the substrate along the plane direction) was 10°.

(2) Evaluation of the Organic EL Display Device

The resultant organic EL display device was evaluated in the same way as in Example 1. About luminescence performance, the luminescence brightness was 60 cd/m$^2$ under the application of a DC voltage of 7 V, and the CIE chromaticity was as follows: CIEx=0.65, and CIEy=0.35. Thus, red luminescence was obtained.

An durability test was performed in the same way as in Example 1. As a result, the luminescence brightness of the respective pixels was uniform (within ±10%). It was confirmed that stable display was kept at a low voltage.

Example 5

(1) Production of an Organic EL Display Device

The structure of an embedded color-converting medium in an organic EL display device was investigated. That is, in Example 1, TFTs were made, and subsequently a photo resist film which opening portions was made in portions where a color-converting medium was to be formed was formed. Next, the resultant product was subjected to sandblasting treatment. The photo resist was stripped to make grooves having a depth of 10 μm in the inter-insulator (gate insulation layer and the like) and the supporting substrate. In the same way as in Example 2, a red color filter and a red fluorescent medium were embedded and formed in the groove.

Next, an acrylate type resist was applied onto the substrate, on which the color-converting medium was formed, by spin coating. Furthermore, the resultant product was exposed to ultraviolet rays so as to form a pattern which opening portions were made only in drain regions of the second transistors (Tr2). Thereafter, the resultant product was developed with 2.38% by weight TMAH, and then baked at 180° C., to form a flattening film (film thickness: 0.5 µm).

Next, electrically connecting members were formed in the same way as in Example 1, so that a level-difference between the drain regions of the Tr2 and the lower electrodes became significantly small (smaller than 1.0 µm). In the resultant organic EL display device, the inclination angle of the electrically connecting members (angle thereof to the substrate along the plane direction) was 45°.

Next, in the same way as in Example 1, lower electrodes, organic EL elements, and the like were formed. In this way, an organic EL display device as shown in FIG. 11 was produced.

(2) Evaluation of the Organic EL Display Device

The resultant organic EL display device was evaluated in the same way as in Example 1. In other words, about luminescence performance, the luminescence brightness was 95 cd/m$^2$ under the application of a DC voltage of 7 V, and the CIE chromaticity was as follows: CIEx=0.65, and CIEy=0.35. Thus, red luminescence was obtained.

An durability test was performed in the same way as in Example 1. As a result, the luminescence brightness of the respective pixels was uniform (within ±10%). It was confirmed that stable display was kept at a low voltage.

Example 6

(1) Production of an Organic EL Display Device

The effect of a position adjusting layer in an organic EL display device was investigated. That is, an aqueous alkoxy silane solution was printed (sol-gel coating) in spots where TFTs were to be formed in the glass substrate of Example 1, and subsequently the resultant product was subjected to heating treatment at 400° C. to make the gel into glass. In this way, a position adjusting layer was formed. The thickness of this position adjusting layer was 10 µm.

Next, TFTs and a color-converting medium were formed in the same way as in Example 2. Furthermore, an acrylate type resist was applied onto the substrate, on which the TFTs and the color-converting medium were formed, by spin coating. Furthermore, the resultant product was exposed to ultraviolet rays so as to form a pattern which opening portions were made only in drain regions of the second transistors (Tr2). Thereafter, the resultant product was developed with 2.38% by weight TMAH, and then baked at 180° C., to form a flattening film (film thickness: 0.5 µm).

Next, electrically connecting members were formed in the same way as in Example 1, so that a level-difference between the drain regions of the Tr2 and the lower electrodes became significantly small (smaller than 1.0 µm). In the resultant organic EL display device, the inclination angle of the electrically connecting members (angle thereof to the substrate along the plane direction) was 45°.

Next, in the same way as in Example 1, lower electrodes and organic EL elements and the like were formed. In this way, an organic EL display device as shown in FIG. 12 was produced.

(2) Evaluation of the Organic EL Display Device

The resultant organic EL display device was evaluated in the same way as in Example 1. In other words, about luminescence performance, the luminescence brightness was 100 cd/m$^2$ under the application of a DC voltage of 7 V, and the CIE chromaticity was as follows: CIEx=0.65, and CIEy=0.35. Thus, red luminescence was obtained.

An durability test was performed in the same way as in Example 1. As a result, the luminescence brightness of the respective pixels was uniform (within ±10%). It was confirmed that stable display was kept at a low voltage.

Comparative Example 1

(1) Production of an Organic EL Display Device.

Figure 20:
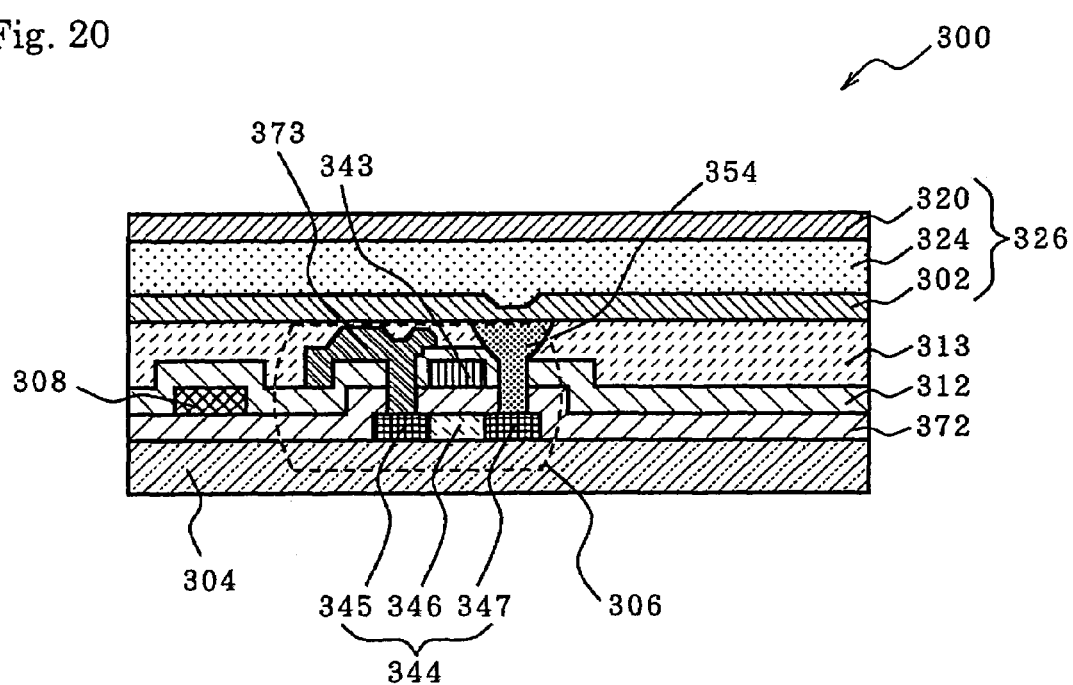
FIG. 20 is a sectional view of a conventional active-driving type organic EL display device (a second example).

An organic EL display device was produced in the same way as in Example 1 except that the electrically connecting members in Example 1 were set in the vertical direction (the inclination angle of the electrically connecting members: 90°) as shown in FIG. 20.

(2) Evaluation of the Organic EL Display Device

The resultant organic EL display device was evaluated in the same way as in Example 1. In other words, about luminescence performance, the luminescence brightness was 50 cd/m$^2$ under the application of a DC voltage of 7 V, and the CIE chromaticity was as follows: CIEx=0.65, and CIEy=0.35. Thus, red luminescence was obtained.

Therefore, in the organic EL display device of Comparative Example 1, its luminescence brightness was lower than Example 1, and luminescence flickered in some pixels and was unstable.

Furthermore, an durability test was performed in the same way as in Example 1. As a result, luminescence was not caused from some pixels. Thus, it was found that stable display was not kept (±30% or more). The reason for this was probably as follows. Since the inclination angle of the electrically connecting members (angle thereof to the substrate) was clearly about 90° (perpendicular), connection between the drain regions of the Tr2 and the electrically connecting members and connection between the lower electrodes and the electrically connecting members were made unstable.

TABLE 1

|  | Inclination Angle | Color Filter | Fluorescent Medium | Luminescence Brightness | Durability Test |
|---|---|---|---|---|---|
| Example 1 | 45° No oblique member | Red | Red | 100 cd/cm$^2$ | ±10% |
| Example 2 | 45° Oblique members were set. | Red | Red | 98 cd/cm$^2$ | ±10% |
| Example 3 | 80° Oblique members were set. | Red | Red | 95 cd/cm$^2$ | ±10% |

TABLE 1-continued

|  | Inclination Angle | Color Filter | Fluorescent Medium | Luminescence Brightness | Durability Test |
|---|---|---|---|---|---|
| Example 4 | 10° No oblique member | Red | None | 60 cd/cm$^2$ | ±10% |
| Comparative Example 1 | 90° No oblique member | Red | Red | 50 cd/cm$^2$ | Greater than ±30% |

INDUSTRIAL APPLICABILITY

According to the active-driving type organic EL display device of the present invention, a lower electrode of an organic EL element and a drain region of a TFT can easily be connected electrically to each other with high connection reliability by forming an inclined electrically connecting member even if a color-converting medium is set onto the side of the lower electrode to cause color display.

According to the method of producing an active-driving type organic EL display device of the present invention, such an active-driving type organic EL display device can be effectively produced.

What is claimed is:

1. An active-driving type organic EL display device, comprising an organic EL element made to have an organic luminous medium sandwiched between an upper electrode and a lower electrode, and a thin film transistor for controlling luminescence of the organic EL element, wherein the luminescence of the organic EL element is taken out from the lower electrode, a color-converting medium is provided on a side of the lower electrode, and the lower electrode is connected to the thin film transsitor by an inclined electrically connecting member across a level difference between the lower electrode and the thin film transistor, the level difference being generated by the color-converting medium.

2. The active-driving type organic EL display device according to claim 1, wherein a flattening film is formed between the color-converting medium and the lower electrode.

3. The active-driving type organic EL display device according to claim 2, wherein the flattening film acts as an oblique meznber for inclining the electrically connecting member.

4. The active-driving type organic EL display device according to claim 2, wherein the flattening film comprises an inorganic substance.

* * * * *